(12) United States Patent
Kawada et al.

(10) Patent No.: US 10,553,402 B2
(45) Date of Patent: Feb. 4, 2020

(54) ANTENNA DEVICE AND PLASMA PROCESSING APPARATUS

(71) Applicant: Tokyo Electron Limited, Tokyo (JP)

(72) Inventors: Yuki Kawada, Miyagi (JP); Naoki Matsumoto, Miyagi (JP); Koji Koyama, Miyagi (JP); Ayako Ito, Miyagi (JP); Takahiro Senda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/394,190

(22) Filed: Apr. 25, 2019

(65) Prior Publication Data

US 2019/0333736 A1 Oct. 31, 2019

(30) Foreign Application Priority Data

Apr. 27, 2018 (JP) .................................. 2018-087335

(51) Int. Cl.
*H01J 37/32* (2006.01)

(52) U.S. Cl.
CPC ..... *H01J 37/3222* (2013.01); *H01J 2237/327* (2013.01)

(58) Field of Classification Search
CPC ............. H01J 37/3222; H01J 37/32229; H01J 37/32238; H01J 37/32192; H01J 2237/327; H05H 1/46; H05H 2001/463; H05H 2001/4615; H05H 2001/4622
See application file for complete search history.

(56) References Cited

U.S. PATENT DOCUMENTS

| | | | |
|---|---|---|---|
| 6,870,512 B2 * | 3/2005 | Yoneda | ..................... H01Q 3/08 343/757 |
| 8,136,479 B2 * | 3/2012 | Sugai | ................ H01J 37/32192 118/723 MW |
| 8,253,511 B2 * | 8/2012 | Oota | ....................... H01P 5/107 333/26 |

(Continued)

FOREIGN PATENT DOCUMENTS

| | | |
|---|---|---|
| JP | 2003-188152 A | 7/2003 |
| JP | 2008-251660 A | 10/2008 |

(Continued)

*Primary Examiner* — Haissa Philogene
(74) *Attorney, Agent, or Firm* — Studebaker & Brackett PC

(57) ABSTRACT

An antenna device according to an exemplary embodiment radiates electromagnetic waves. In the antenna device, a dielectric window is in contact with a lower wall of a first waveguide, the first waveguide is provided between the dielectric window and a second waveguide and extends in a direction crossing a tube axis of the second waveguide, a dispersion part in the first waveguide disperses the electromagnetic waves in the first waveguide, two inner conductors disposed at different distances from the tube axis and connected to the dielectric window include coaxial conversion parts which cause propagation of the electromagnetic waves dispersed by the dispersion part to direct to the dielectric window side, a body length of the inner conductor most distant from the tube axis, out of body lengths of the two inner conductors, is longer, and a front surface of the dielectric window does not have irregularities.

17 Claims, 14 Drawing Sheets

(56) References Cited

U.S. PATENT DOCUMENTS

| | | | |
|---|---|---|---|
| 9,101,042 B2 * | 8/2015 | Voronin | H05H 1/46 |
| 10,158,158 B2 * | 12/2018 | Kirino | H01P 1/025 |
| 10,332,728 B2 * | 6/2019 | Okunishi | H05H 1/46 |
| 2005/0205015 A1 * | 9/2005 | Sasaki | C23C 16/45565 |
| | | | 118/723 MA |
| 2019/0279845 A1 * | 9/2019 | Matsumoto | H01J 37/32238 |

FOREIGN PATENT DOCUMENTS

| | | |
|---|---|---|
| JP | 2012-216631 A | 11/2012 |
| JP | 2013-016443 A | 1/2013 |
| JP | 2014-075234 A | 4/2014 |
| JP | 2015-130325 A | 7/2015 |
| WO | 2008/123605 A1 | 10/2008 |
| WO | 2008/153053 A1 | 12/2008 |

* cited by examiner

ANTENNA DEVICE AND PLASMA PROCESSING APPARATUS

CROSS-REFERENCE TO RELATED APPLICATIONS

This application is based on and claims the benefit of priority from Japanese Patent Application No. 2018-087335 filed on Apr. 27, 2018 with the Japan Patent Office, the entire contents of which are incorporated herein by reference.

TECHNICAL FIELD

Exemplary embodiments of this disclosure relate to an antenna device and a plasma processing apparatus.

BACKGROUND

There is a case where plasma processing apparatuses for performing film formation, etching, or the like on a semiconductor wafer use various antennas such as a radial line slot antenna (RLSA). Such a plasma processing apparatus can generate plasma in a processing container with the wafer accommodated therein (Japanese Translation of PCT International Application Publication No. 2008-153053, Japanese Unexamined Patent Publication No. 2008-251660, Japanese Unexamined Patent Publication No. 2013-16443, Japanese Unexamined Patent Publication No. 2012-216631, Japanese Unexamined Patent Publication No. 2014-075234, Japanese Unexamined Patent Publication No. 2003-188152, and Japanese Unexamined Patent Publication No. 2015-130325). Republished Japanese Translation No. 2008-153053 for PCT International Publication discloses a technique aimed at providing a microwave transmission line using a coaxial tube.

Japanese Unexamined Patent Publication No. 2008-251660 discloses a technique relating to generation of plasma having a high density and a low electron temperature, which can realize higher efficiency of a processing gas introduction part and improvement in uniformity and controllability of a plasma density distribution. Japanese Unexamined Patent Publication No. 2013-16443 discloses a technique relating to an antenna, a dielectric window, a plasma processing apparatus, and a plasma processing method, in which it is possible to realize improvement in in-plane uniformity of a substrate surface processing amount.

Japanese Unexamined Patent Publication No. 2012-216631 discloses a technique capable of improving etching resistance of a silicon nitride film formed by a low-temperature atomic layer deposition (ALD) method. Japanese Unexamined Patent Publication No. 2014-075234 discloses a technique relating to an antenna and a plasma processing apparatus, in which it is possible to improve radiation electric field intensity with respect to input power to improve plasma stability.

Japanese Unexamined Patent Publication No. 2003-188152 discloses a technique capable of realizing stabilization of an operation of a plasma processing apparatus performing circularly polarized wave feeding and an increase in continuous operation time of the plasma processing apparatus. Japanese Unexamined Patent Publication No. 2015-130325 discloses a technique relating to a dielectric window, an antenna, and a plasma processing apparatus, in which it is possible to improve in-plane uniformity of plasma.

SUMMARY

According to one exemplary embodiment, an antenna device is provided. The antenna device radiates electromagnetic waves. The antenna device includes a first waveguide, a second waveguide, a third waveguide, a fourth waveguide, a dielectric window, a first inner conductor, and a second inner conductor. The second waveguide is connected to an upper wall of the first waveguide and communicates with the first waveguide. The dielectric window is in contact with a lower wall of the first waveguide. The first waveguide is provided between the dielectric window and the second waveguide, extends in a direction crossing a tube axis of the second waveguide, and includes a dispersion part, a first coaxial conversion part, and a second coaxial conversion part. The third waveguide is connected to the lower wall on the dielectric window side and communicates with the first waveguide. The fourth waveguide is connected to the lower wall on the dielectric window side and communicates with the first waveguide. The first inner conductor extends along a direction of the tube axis from an inside of the first waveguide to an inside of the third waveguide. A first end of the first inner conductor is in contact with the dielectric window through a first opening end of the third waveguide. A second end of the first inner conductor is in contact with the upper wall. The first opening end is connected to the dielectric window. The second inner conductor extends along the direction of the tube axis from the inside of the first waveguide to an inside of the fourth waveguide. A third end of the second inner conductor is in contact with the dielectric window through a second opening end of the fourth waveguide. A fourth end of the second inner conductor is in contact with the upper wall. The second opening end is connected to the dielectric window. A first central axis of the first inner conductor and a second central axis of the second inner conductor extend along the tube axis. A distance between the first central axis and the tube axis is longer than a distance between the second central axis and the tube axis. The dispersion part is disposed on the tube axis and on the lower wall in the first waveguide and disperses electromagnetic waves guided along the tube axis by the second waveguide in the direction crossing the tube axis in the first waveguide. The first coaxial conversion part is included in the first inner conductor in the first waveguide and causes propagation of the electromagnetic waves which are dispersed by the dispersion part and reach the first inner conductor to direct to the dielectric window side. The second coaxial conversion part is included in the second inner conductor in the first waveguide and causes propagation of the electromagnetic waves which are dispersed by the dispersion part and reach the second inner conductor to direct to the dielectric window side. The dielectric window has a back surface which is in contact with the first waveguide and a front surface disposed on a side opposite to the back surface. The front surface extends in the direction crossing the tube axis and does not have irregularities.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIGS. 10A to 10C are diagrams illustrating a variation of the shape of a front surface of a dielectric window, in which FIG. 10A illustrates the cross-section of the dielectric window, FIG. 10B illustrates the dielectric window as viewed from the back surface side, and FIG. 10C illustrates the dielectric window as viewed from the front surface side.

FIGS. 11A to 11C are diagrams illustrating a variation of the shape of the front surface of the dielectric window, in which FIG. 11A illustrates the cross-section of the dielectric window, FIG. 11B illustrates the dielectric window as viewed from the back surface side, and FIG. 11C illustrates the dielectric window as viewed from the front surface side.

FIGS. 12A to 12C are diagrams illustrating a variation of the shape of the front surface of the dielectric window, in which FIG. 12A illustrates the cross-section of the dielectric window, FIG. 12B illustrates the dielectric window as viewed from the back surface side, and FIG. 12C illustrates the dielectric window as viewed from the front surface side.

FIGS. 13A to 13C are diagrams illustrating a variation of the shape of the front surface of the dielectric window, in which FIG. 13A illustrates the cross-section of the dielectric window, FIG. 13B illustrates the dielectric window as viewed from the back surface side, and FIG. 13C illustrates the dielectric window as viewed from the front surface side.

FIGS. 14A to 14C are diagrams illustrating a variation of the shape of the front surface of the dielectric window, in which FIG. 14A illustrates the cross-section of the dielectric window, FIG. 14B illustrates the dielectric window as viewed from the back surface side, and FIG. 14C illustrates the dielectric window as viewed from the front surface side.

DETAILED DESCRIPTION

Figure 1:
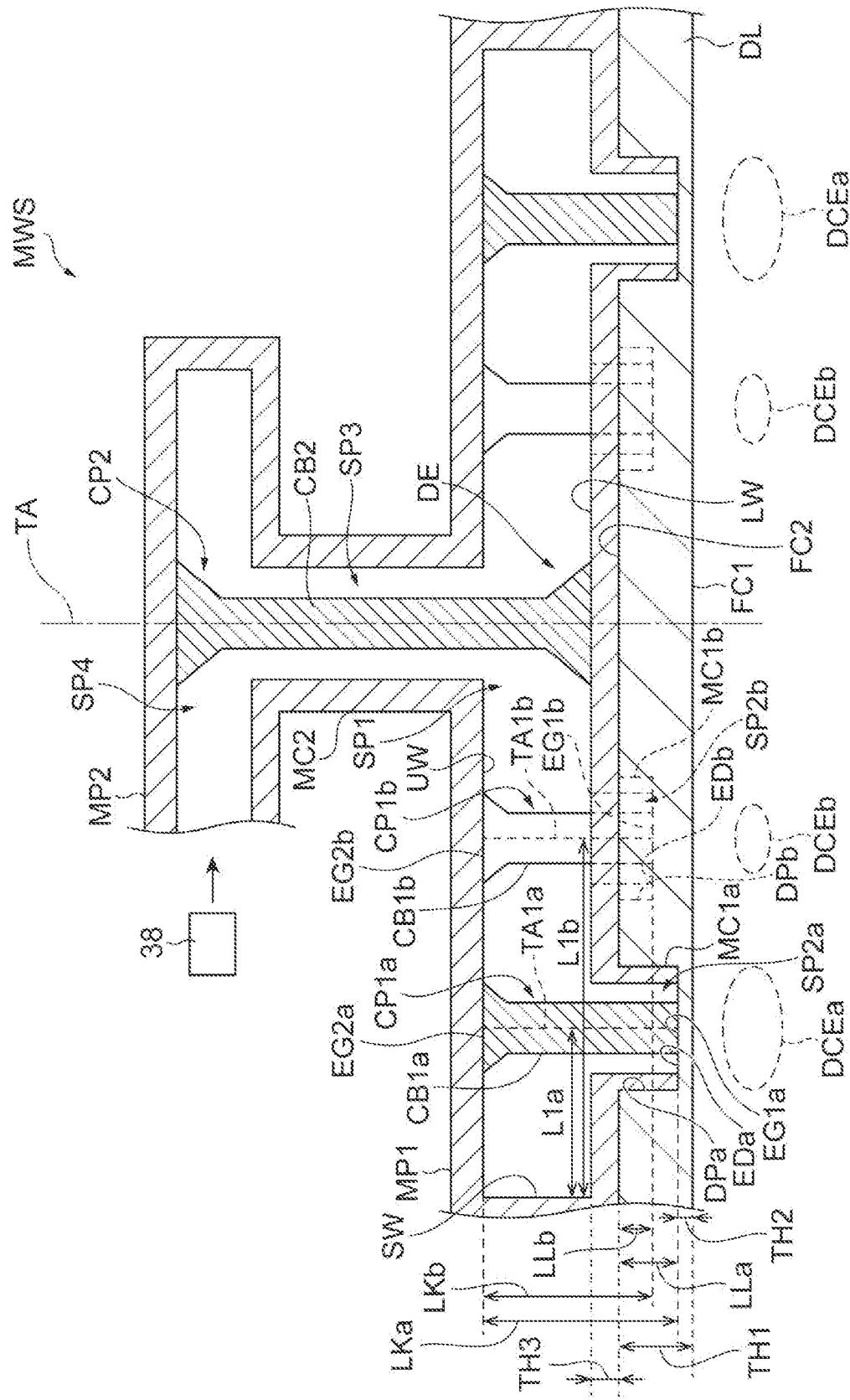
FIG. 1 is a sectional view schematically illustrating a configuration of an antenna device according to one exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

This disclosure provides a technique capable of introducing electromagnetic waves which locally generate relatively high-density plasma into a processing container without providing a recess on the surface of the dielectric window.

DESCRIPTION OF EXEMPLARY EMBODIMENTS OF THIS DISCLOSURE

First, various exemplary embodiments of this disclosure will be listed and described. According to one exemplary embodiment, an antenna device is provided. The antenna device radiates electromagnetic waves. The antenna device includes a first waveguide, a second waveguide, a third waveguide, a fourth waveguide, a dielectric window, a first inner conductor, and a second inner conductor. The second waveguide is connected to an upper wall of the first waveguide and communicates with the first waveguide. The dielectric window is in contact with a lower wall of the first waveguide. The first waveguide is provided between the dielectric window and the second waveguide, extends in a direction crossing a tube axis of the second waveguide, and includes a dispersion part, a first coaxial conversion part, and a second coaxial conversion part. The third waveguide is connected to the lower wall on the dielectric window side and communicates with the first waveguide. The fourth waveguide is connected to the lower wall on the dielectric window side and communicates with the first waveguide. The first inner conductor extends along a direction of the tube axis from an inside of the first waveguide to an inside of the third waveguide. A first end of the first inner conductor is in contact with the dielectric window through a first opening end of the third waveguide. A second end of the first inner conductor is in contact with the upper wall. The first opening end is connected to the dielectric window. The second inner conductor extends along the direction of the tube axis from the inside of the first waveguide to an inside of the fourth waveguide. A third end of the second inner conductor is in contact with the dielectric window through a second opening end of the fourth waveguide. A fourth end of the second inner conductor is in contact with the upper wall. The second opening end is connected to the dielectric window. A first central axis of the first inner conductor and a second central axis of the second inner conductor extend along the tube axis. A distance between the first central axis and the tube axis is longer than a distance between the second central axis and the tube axis. The dispersion part is disposed on the tube axis and on the lower wall in the first waveguide and disperses electromagnetic waves guided along the tube axis by the second waveguide in the direction crossing the tube axis in the first waveguide. The first coaxial conversion part is included in the first inner conductor in the first waveguide and causes propagation of the electromagnetic waves which are dispersed by the dispersion part and reach the first inner conductor to direct to the dielectric window side. The second coaxial conversion part is included in the second inner conductor in the first waveguide and causes propagation of the electromagnetic waves which are dispersed by the dispersion part and reach the second inner conductor to direct to the dielectric window side. The dielectric window has a back surface which is in contact with the first waveguide and a front surface disposed on a side opposite to the back surface. The front surface extends in the direction crossing the tube axis and does not have irregularities. According to the configuration described above, the electromagnetic waves can be locally radiated from a flat front surface of the dielectric window due to the dispersion part, the first coaxial conversion part, the second coaxial conversion part, the first inner conductor, and the second inner conductor. Further, the first inner conductor and the second inner conductor are disposed such that the distances thereof front the tube axis are different from each other. Therefore, even in a case where a sudden transition occurs in the impedances of either the first inner conductor or the second inner conductor, the radiation of the electromagnetic waves from the tube axis side becomes possible.

In one exemplary embodiment, a body length of the first inner conductor from the first opening end to the upper wall may be a value of an odd multiple of a reference length set in advance. The body length of the first inner conductor may not be shorter than the body length of the second inner conductor. The reference length may be a value of a quarter of the wavelength of the electromagnetic wave which is introduced into the second waveguide and propagates through the second waveguide. Therefore, electromagnetic waves having relatively high intensity can be radiated from the opening end. The electromagnetic wave which is radiated from the first opening end is higher in intensity and wider in range than the electromagnetic wave which is radiated from the second opening end.

In one exemplary embodiment, the front surface may have a flat surface. In one exemplary embodiment, the front surface may have any one of a shape protruding in a direction away from the back surface and having no irregularities, and a shape recessed in a direction toward the back surface and having no irregularities. In one exemplary embodiment, the shape of the front surface may be a curved surface shape. In one exemplary embodiment, irregularities may not be provided in a portion facing the first opening end of the third waveguide and a portion facing the second opening end of the fourth waveguide, of the front surface. In this manner, the shape of the front surface can be various shapes having no irregularities.

In one exemplary embodiment, the antenna device may further include a third inner conductor. The third inner conductor may be disposed on the tube axis and extend from the inside of the second waveguide to the inside of the first waveguide. In this manner, since the third inner conductor is disposed on the tube axis of the second waveguide in the second waveguide, the electromagnetic waves can be favorably guided in the second waveguide.

In one exemplary embodiment, a gas line which is connected to an external gas supply system may be provided in the interior of the third inner conductor. The gas line may penetrate the third inner conductor and the dielectric window and communicate with a space on the front surface. In this manner, due to the gas line, the preferable supply of a gas from the front surface of the dielectric window into a space on the front surface becomes possible.

In one exemplary embodiment, a refrigerant tube which is connected to an external chiller unit is provided in the interior of the first inner conductor and the interior of the second inner conductor. In this manner, due to a refrigerant which is supplied (circulated) from the chiller unit to the interior of the first inner conductor and the interior of the second inner conductor through the refrigerant tube, the first inner conductor which includes the first coaxial conversion part and the second inner conductor which includes the second coaxial conversion part can be cooled to a suitable temperature. When the electromagnetic waves are propagated to the first inner conductor and the first coaxial conversion part and when the electromagnetic waves are propagated to the second inner conductor and the second coaxial conversion part, there is a case where the first inner conductor and the first coaxial conversion part, and the second inner conductor and the second coaxial conversion part are heated. Even in such a case, the temperatures of the first inner conductor and the first coaxial conversion part and the temperatures of the second inner conductor and the second coaxial conversion part can be kept constant. Therefore, the conversion of a traveling direction of the electromagnetic wave in the first coaxial conversion part and the second coaxial conversion part, and the wave guide of the electromagnetic wave along the first inner conductor and the second inner conductor can be stably and favorably realized.

In one exemplary embodiment, a heater which is connected to an external heater power supply may be provided in the interior of the lower wall or between the lower wall and the dielectric window. In this manner, due to the heater, the temperatures of the first to fourth waveguides and the temperature of the dielectric window can be raised to a suitable temperature. If plasma is generated, there is a case where the temperature of the dielectric window and the temperatures of the first to fourth waveguides rise due to heat input from the plasma. In such a case, heating is performed in advance by the heater, whereby a temperature change of each of the first to fourth waveguides before the plasma generation and during the plasma generation can be reduced. Therefore, the wave guide of the electromagnetic waves in each of the first to fourth waveguides is favorably performed, and thus stable plasma can be generated.

In one exemplary embodiment, a protective film may be provided on the flat front surface of the dielectric window. In this manner, since the protective film is provided on the flat front surface, the protective film can be conformally and easily formed with a uniform film thickness over the front surface.

In one exemplary embodiment, the first opening end and the second opening end may be located between the front surface and the back surface, and the distance between the back surface and the first opening end may not be shorter than the distance between the back surface and the second opening end. In one exemplary embodiment, the dielectric window may include, on the back surface, a first recessed portion which accommodates the third waveguide and a second recessed portion which accommodates the fourth waveguide.

In one exemplary embodiment, in the dielectric window, the distance between the back surface and the front surface may be substantially equal to the distance between the first opening end and the front surface.

In one exemplary embodiment, the thickness of the lower wall may be substantially equal to the thickness of the upper wall. In one exemplary embodiment, the thickness of the lower wall may be thicker than the thickness of the upper wall.

According to one exemplary embodiment, it is possible to introduce electromagnetic waves locally generating relatively high-density plasma into the processing container without providing a recess on the front surface of the dielectric window.

Details of Exemplary Embodiments of this Disclosure

Hereinafter, various exemplary embodiments will be described in detail with reference to the drawings. In each drawing, identical or corresponding portions are denoted by the same reference numerals.

First Exemplary Embodiment

Figure 2:
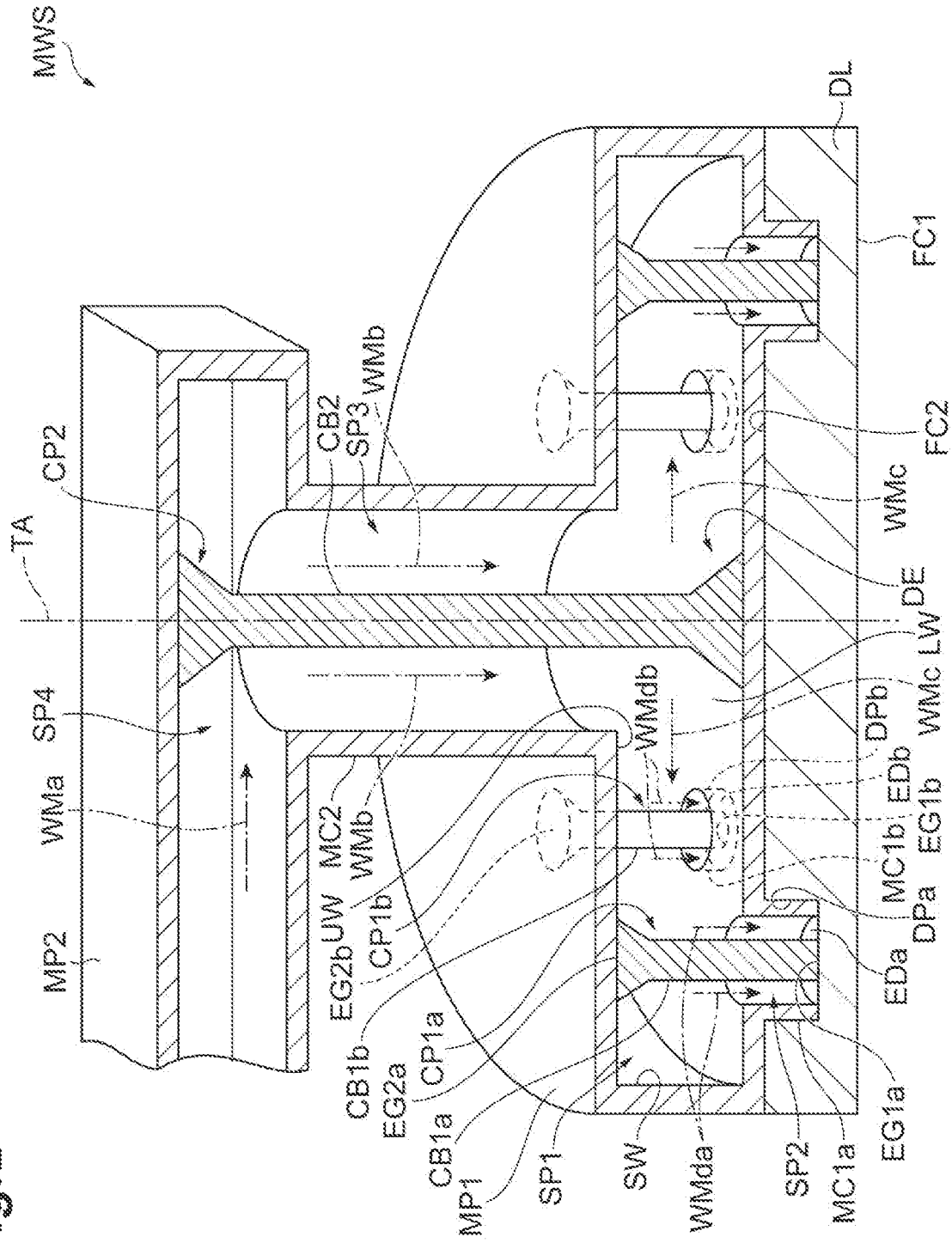
FIG. 2 is a diagram for describing the configuration of the antenna device illustrated in FIG. 1.
Figure 3:
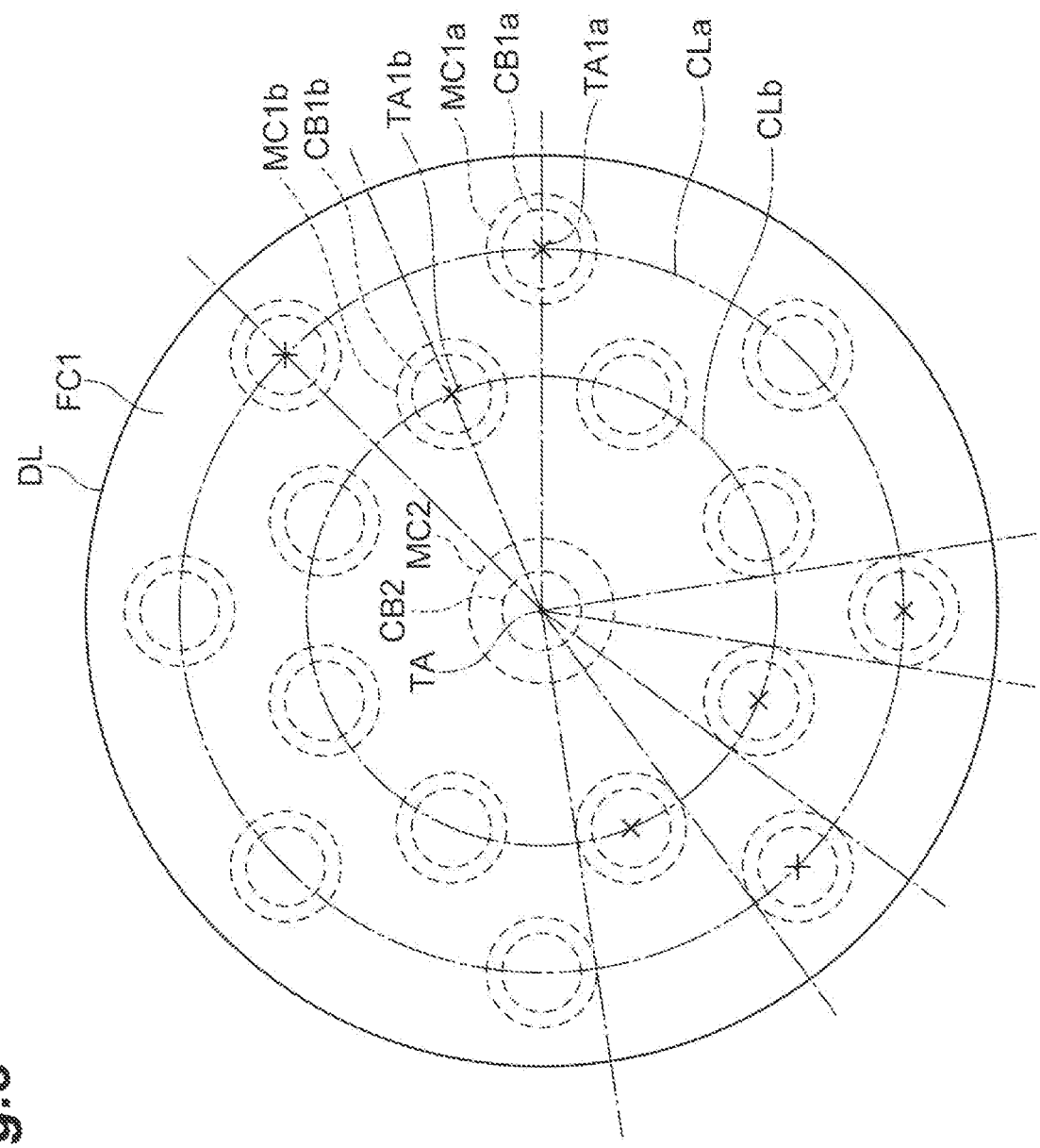
FIG. 3 is a view illustrating a position of an inner conductor of the antenna device illustrated in FIG. 1.

An antenna device MWS according to one exemplary embodiment will be described with reference to FIGS. 1 to 3. FIG. 1 is a sectional view schematically illustrating a configuration of the antenna device MWS according to one exemplary embodiment. FIG. 2 is a diagram for describing the configuration of the antenna device MWS illustrated in FIG. 1. FIG. 3 is a view illustrating the positions of an inner conductor CB1$a$ and an inner conductor CB1$b$ of the antenna device MWS illustrated in FIG. 1.

As illustrated in FIG. 1, the antenna device MWS can radiate electromagnetic waves to an electric discharge area DCEa, an electric discharge area DCEb, or the like. The electromagnetic waves which are radiated by the antenna device MWS can be supplied from an electromagnetic wave generation system 38 illustrated in FIG. 4 which will be described later.

The antenna device MWS includes a distribution waveguide MP1 (a first waveguide), a coaxial waveguide MC2 (a second waveguide), a coaxial waveguide MC1$a$ (a third waveguide), and a coaxial waveguide MC1$b$ (a fourth waveguide). The antenna device MWS further includes a dielectric window DL, the inner conductor CB1$a$ (a first inner conductor), and the inner conductor CB1$b$ (a second inner conductor). A material of each of the distribution waveguide MP1, the coaxial waveguide MC2, the coaxial waveguide MC1$a$, the coaxial waveguide MC1$b$, the inner conductor CB1$a$, and the inner conductor CB1$b$ includes metal having conductivity.

The distribution waveguide MP1 is provided between the dielectric window DL and the coaxial waveguide MC2. The distribution waveguide MP1 extends in a direction crossing a tube axis TA of the coaxial waveguide MC2. The distribution waveguide MP1 has an upper wall UW, a lower wall LW, and a side wall SW.

The upper wall UW and the lower wall LW face each other. The side wall SW connects an edge of the upper wall UW and an edge of the lower wall LW. An intra-tube space SP1 of the distribution waveguide MP1 is defined by the upper wall UW, the lower wall LW, and the side wall SW.

The distribution waveguide MP1 is provided with a dispersion part DE. The dispersion part DE is disposed on the tube axis TA of the coaxial waveguide MC2 and on the lower wall LW in the distribution waveguide MP1. The dispersion part DE can disperse electromagnetic waves guided along the tube axis TA by the coaxial waveguide MC2 in the direction crossing the tube axis TA in the distribution waveguide MP1. More specifically, the dispersing part DE changes a traveling direction WMb to a traveling direction WMc, as illustrated in FIG. 2.

The traveling direction WMb is a traveling direction of the electromagnetic wave which is guided along the tube axis TA by the coaxial waveguide MC2. The traveling direction WMc is a traveling direction crossing the tube axis TA in the distribution waveguide MP1. The traveling direction WMc is a direction directing toward the inner conductor CB1$a$, the inner conductor CB1$b$, and the side wall SW of the distribution waveguide MP1 from the dispersion part DE.

The dispersion part DE includes a portion made of metal, and this portion has a shape such as a cone (or a truncated cone), for example. The dispersion part DE can be included in an inner conductor CB2 (a third inner conductor), which will be described later.

The coaxial waveguide MC1$a$ is connected to the lower wall LW on the dielectric window DL side. The coaxial waveguide MC1$a$ communicates with the distribution waveguide MP1. More specifically, an intra-tube space SP2$a$ of the coaxial waveguide MC1$a$ communicates with the intra-tube space SP1 of the distribution waveguide MP1. The coaxial waveguide MC1$a$ has an opening end EDa (a first opening end). The opening end EDa is connected to the dielectric window DL.

The coaxial waveguide MC1$b$ is connected to the lower wall LW on the dielectric window DL side. The coaxial waveguide MC1$b$ communicates with the distribution waveguide MP1. More specifically, an intra-tube space SP2$b$ of the coaxial waveguide MC1$b$ communicates with the intra-tube space SP1 of the distribution waveguide MP. The coaxial waveguide MC1$b$ has an opening end EDb (a second opening end). The opening end EDb is connected to the dielectric window DL.

The inner conductor CB1$a$ extends from the inside of the distribution waveguide MP1 to the inside of the coaxial waveguide MC1$a$ along the direction of the tube axis TA. The inner conductor CB1$a$ has an end EG1$a$ (a first end) and an end EG2$a$ (a second end). The end EG1$a$ is in contact with the dielectric window DL through the opening end EDa. The end EG2$a$ is in contact with the upper wall UW.

The inner conductor CB1$b$ extends from the inside of the distribution waveguide MP1 to the inside of the coaxial waveguide MC1$b$ along the direction of the tube axis TA. The inner conductor CB1$b$ has an end EG1$b$ (a third end) and an end EG2$b$ (a fourth end). The end EG1$b$ is in contact with the dielectric window DL through the opening end EDb. The end EG2$b$ is in contact with the upper wall UW.

A central axis TA1$a$ (a first central axis) of the inner conductor CB1$a$ and a central axis TA1$b$ (a second central axis) of the inner conductor CB1$b$ extend along the tube axis TA. The distance between the central axis TA1$a$ and the tube axis TA is longer than the distance between the central axis TA1$b$ and the tube axis TA. The central axis TA1$a$ can overlap the tube axis of the coaxial waveguide MC1$a$. The central axis TA1$b$ can overlap the tube axis of the coaxial waveguide MC1$b$.

The distribution waveguide MP1 is provided with a coaxial conversion part CP1$a$ (a first coaxial conversion part). The coaxial conversion part CP1$a$ is included in the inner conductor CB1$a$ in the distribution waveguide MP1. The coaxial conversion part CP1$a$ can cause the propagation of the electromagnetic waves which are dispersed by the dispersion part DE and reach the inner conductor CB1$a$ to direct to the dielectric window DL side.

More specifically, the coaxial dispersing part CP1$a$ changes the traveling direction WMc to a traveling direction WMda, as illustrated in FIG. 2. The traveling direction WMc is a traveling direction of the electromagnetic waves which are dispersed by the dispersion part DE and reach the inner conductor CB1$a$. The traveling direction WMda is a traveling direction directing toward the opening end EDa of the coaxial waveguide MC1$a$ along the inner conductor CB1$a$.

The distribution waveguide MP1 is provided with a coaxial conversion part CP1$b$ (a second coaxial conversion part). The coaxial conversion part CP1$b$ is included in the inner conductor CB1$b$ in the distribution waveguide MP1. The coaxial conversion part CP1$b$ can cause the propagation of the electromagnetic waves which are dispersed by the dispersion part DE and reach the inner conductor CB1$b$ to direct to the dielectric window DL side.

More specifically, the coaxial dispersing part CP1$b$ changes the traveling direction WMc to a traveling direction WMdb, as illustrated in FIG. 2. The traveling direction WMdb is a traveling direction directing toward the opening end EDb of the coaxial waveguide MC1$b$ along the inner conductor CB1$b$.

An electromagnetic wave is radiated from the opening end EDa to the electric discharge area DCEa on a front surface FC1 of the dielectric window DL. An electromagnetic wave is radiated from the opening end EDb to the electric discharge area DCEb on the front surface FC1 of the dielectric window DL.

The coaxial waveguide MC2 is connected to the upper wall UW of the distribution waveguide MP1. The coaxial waveguide MC2 communicates with the distribution waveguide MP1. More specifically, an intra-tube space SP3 of the coaxial waveguide MC2 communicates with the intra-tube space SP1 of the distribution waveguide MP1.

The coaxial waveguide MC2 virtually has the tube axis TA. The tube axis TA passes through approximately the center of the cross-section of the coaxial waveguide MC2. The coaxial waveguide MC2 extends along the tube axis TA.

The dielectric window DL is in contact with the lower wall LW of the distribution waveguide MP1. The dielectric window DL extends along the distribution waveguide MP1 in the direction crossing the tube axis TA of the coaxial waveguide MC2. A material of the dielectric window DL can be, for example, quartz ($SiO_2$) or ceramic ($Al_2O_3$).

The dielectric window DL has the front surface FC1 and a back surface FC2. The front surface FC1 is disposed on the side opposite to the back surface FC2. The back surface FC2 is in contact with the distribution waveguide MP1. The front surface FC1 extends in the direction crossing the tube axis TA. The front surface FC1 has a flat shape. A configuration for localizing the electromagnetic waves, for example, a configuration such as a groove or a recess (dimple) is not provided in the front surface FC1.

A body length LKa of the inner conductor CB1a from the opening end EDa to the upper wall UW is a value of an odd multiple of a reference length set in advance. The reference length can be a value of a quarter of a wavelength λg of the electromagnetic wave which is introduced into the coaxial waveguide MC2 and propagates through the coaxial waveguide MC2 (hereinafter, the same). That is, the reference length=λg/4. In this disclosure, the equal sign (=) indicates that the left and right values of the equal sign are approximately the same, and does not indicate that the values are strictly the same.

It is preferable that a body length LKb of the inner conductor CB1b from the opening end EDb to the upper wall UW is a value of an odd multiple of the reference length. However, there is no limitation thereto. The body length LKa of the inner conductor CB1a is not shorter than the body length LKb of the inner conductor CB1b (is equal to or larger than the body length LKb) (LKb≤LKa). When each of m and n is an integer of 1 or more, LKa=(λg/4)×(2×m+1), LKb(λg/4)×(2×n+1), and LKb≤LKa (n≤m).

In the dielectric window DL, the distance between the back surface FC2 and the front surface FC1 is a thickness TH1 of the dielectric window DL. The distance between the opening end EDa and the front surface FC1 is a thickness TH2 of the portion which is in contact with the coaxial waveguide MC1a, of the dielectric window DL.

The thickness TH1 is larger than the thickness TH2 (TH1>TH2). Or, the thickness TH1 is substantially equal to the thickness TH2 (TH1=TH2). The distance between the back surface FC2 and the opening end EDa is set to be LLa, and the distance between the back surface FC2 and the opening end EDb is set to be LLb. In the case of TH1>TH2, LLa is a positive value (LLa>0), and LLb is a value equal to or larger than zero (LLb≥0).

In the case of TH1>TH2 and LLb>0, the opening end EDa and the opening end EDb are located between the front surface FC1 and the back surface FC2. In a case where the body length LKa of the inner conductor CB1a is longer than the body length LKb of the inner conductor CB1b, that is, in the case of LKb<LKa, the distance LLa between the back surface FC2 and the opening end EDa is longer than the distance LLb between the back surface FC2 and the opening end EDb (LLa>LLb). Further, in a case where the body length LKa of the inner conductor CB1a is equal to the body length LKb of the inner conductor CB1b, that is, in the case of LKb=LKa, the distance LLa between the back surface FC2 and the opening end EDa is equal to the distance LLb between the back surface FC2 and the opening end EDb (LLa=LLb). The dielectric window DL includes, on the back surface FC2, a recessed portion DPa (a first recessed portion) which accommodates the coaxial waveguide MC1a and a recessed portion DPb (a second recessed portion) which accommodates the coaxial waveguide MC1b.

Also in the case of TH1>TH2 and LLb=0, the distance LLa between the back surface FC2 and the opening end EDa is longer than the distance LLb between the back surface FC2 and the opening end EDb (LLa>LLb=0). In this case, the dielectric window DL has the recessed portion DPa on the back surface FC2. However, the recessed portion DPb is not provided in the dielectric window DL. The opening end EDa is located between the front surface FC1 and the back surface FC2. The opening end EDb is located on the back surface FC2 or located in the lower wall LW.

In the case of TH1=TH2, this corresponds to a case where both of LLa and LLb are about zero (LLa=0=LLb). In this case, a thickness TH3 of the lower wall LW is substantially the same as the thickness of the upper wall UW, or the thickness TH3 of the lower wall LW is thicker than the thickness of the upper wall UW.

A distance L1a from the side wall SW of the distribution waveguide MP1 to the central axis TA1a of the inner conductor CB a is the reference length. That is, the distance L1a (the reference length) satisfies the relationship, L1a=λg/4. Since the central axis TA1a of the inner conductor CB1a is disposed at the position of an antinode of a standing wave having a node formed on the side wall SW, efficient coaxial conversion becomes possible.

A distance L1b from the side wall SW of the distribution waveguide MP1 to the central axis TA1b of the inner conductor CB1b is an odd multiple of the reference length (three or more times). Since the central axis TA1b of the inner conductor CB1b is disposed at the position of an antinode of a standing wave having a node formed on the side wall SW, efficient coaxial conversion becomes possible.

The antenna device MWS further includes the inner conductor CB2. The inner conductor CB2 is disposed on the tube axis TA of the coaxial waveguide MC2 and extends from the inside of the coaxial waveguide MC2 to the inside of the distribution waveguide MP1. The inner conductor CB2 is disposed approximately at the center of the coaxial waveguide MC2 when viewed from the cross-section of the coaxial waveguide MC2.

A material of the inner conductor CB2 includes metal having conductivity. As the material of the inner conductor CB2, for example, aluminum plated with silver can be used. However, a low resistance material can be used in a place thicker than a skin depth of the outermost surface.

The inner conductor CB2 includes the dispersion part DE. That is, the inner conductor CB2 is connected to the lower wall LW of the distribution waveguide MP1. The inner conductor CB2 extends from the lower wall LW toward above the lower wall LW and passes through the coaxial waveguide MC2.

An introduction waveguide MP2 is provided on the coaxial waveguide MC2. The introduction waveguide MP2 is connected to an end portion of the coaxial waveguide MC2 and communicates with the coaxial waveguide MC2. More specifically, an intra-tube space SP4 of the introduction waveguide MP2 communicates with the intra-tube space SP3 of the coaxial waveguide MC2.

The inner conductor CB2 is connected to an inner wall of the introduction waveguide MP2. The inner conductor CB2 extends from the inner wall of the introduction waveguide MP2 toward the coaxial waveguide MC2.

The inner conductor CB2 further extends inside the coaxial waveguide MC2 along the tube axis TA of the coaxial waveguide MC2 to pass through the coaxial waveguide MC2. The inner conductor CB2 is connected to the lower wall LW of the distribution waveguide MP1.

The introduction waveguide MP2 is provided with a coaxial conversion part CP2. The coaxial conversion part CP2 is included in the inner conductor CB2 in the introduction waveguide MP2. The coaxial conversion part CP2 can cause the propagation of the electromagnetic waves from the electromagnetic wave generation system 38 to direct in the direction along the tube axis TA of the coaxial waveguide MC2. More specifically, the coaxial conversion part CP2 changes a traveling direction WMa of the electromagnetic wave to the traveling direction WMb along the tube axis TA, as illustrated in FIG. 2.

In one exemplary embodiment, the planar shape of each of the distribution waveguide MP1 and the dielectric window DL (the shape of each of the distribution waveguide MP1 and the dielectric window DL when viewed from the direction of the tube axis TA of the coaxial waveguide MC2) can be an approximately circular shape.

In one exemplary embodiment, the antenna device MWS is provided with a plurality of coaxial waveguides MC1$a$ and a plurality of inner conductors CB1$a$. The plurality of coaxial waveguides MC1$a$ and the plurality of inner conductors CB1$a$ are disposed at approximately equal intervals on an imaginary line CLa when viewed from the front surface FC1 side of the dielectric window DL, as illustrated in FIG. 3. The imaginary line CLa is a circular shape centered on the tube axis TA of the coaxial waveguide MC2.

In one exemplary embodiment, the antenna device MWS is provided with a plurality of coaxial waveguides MC1$b$ and a plurality of inner conductors CB1$b$. The plurality of coaxial waveguides MC1$b$ and the plurality of inner conductors CB1$b$ are disposed at approximately equal intervals on an imaginary line CLb when viewed from the front surface FC1 side of the dielectric window DL, as illustrated in FIG. 3. The imaginary line CLb is a circular shape centered on the tube axis TA of the coaxial waveguide MC2 and is a concentric circle with respect to the imaginary line CLa.

The length of the diameter of the imaginary line CLb (the distance from the tube axis TA to the imaginary line CLb) is shorter than the length of the diameter of the imaginary line CLa (the distance from the tube axis TA to the imaginary line CLa). When viewing the side of the edge of the dielectric window DL from the tube axis TA, the coaxial waveguide MC1$a$ and the coaxial waveguide MC1$b$ do not overlap each other (are alternately disposed). In other words, when viewing the side of the edge of the dielectric window DL from the tube axis TA, one central axis TA1$b$ is disposed approximately at the center between two central axes TA1$a$ adjacent to each other. Further, it is preferable that at least the line connecting the tube axis TA and the central axis TA1$a$ does not overlap the line connecting the tube axis TA and the central axis TA1$b$.

Figure 4:
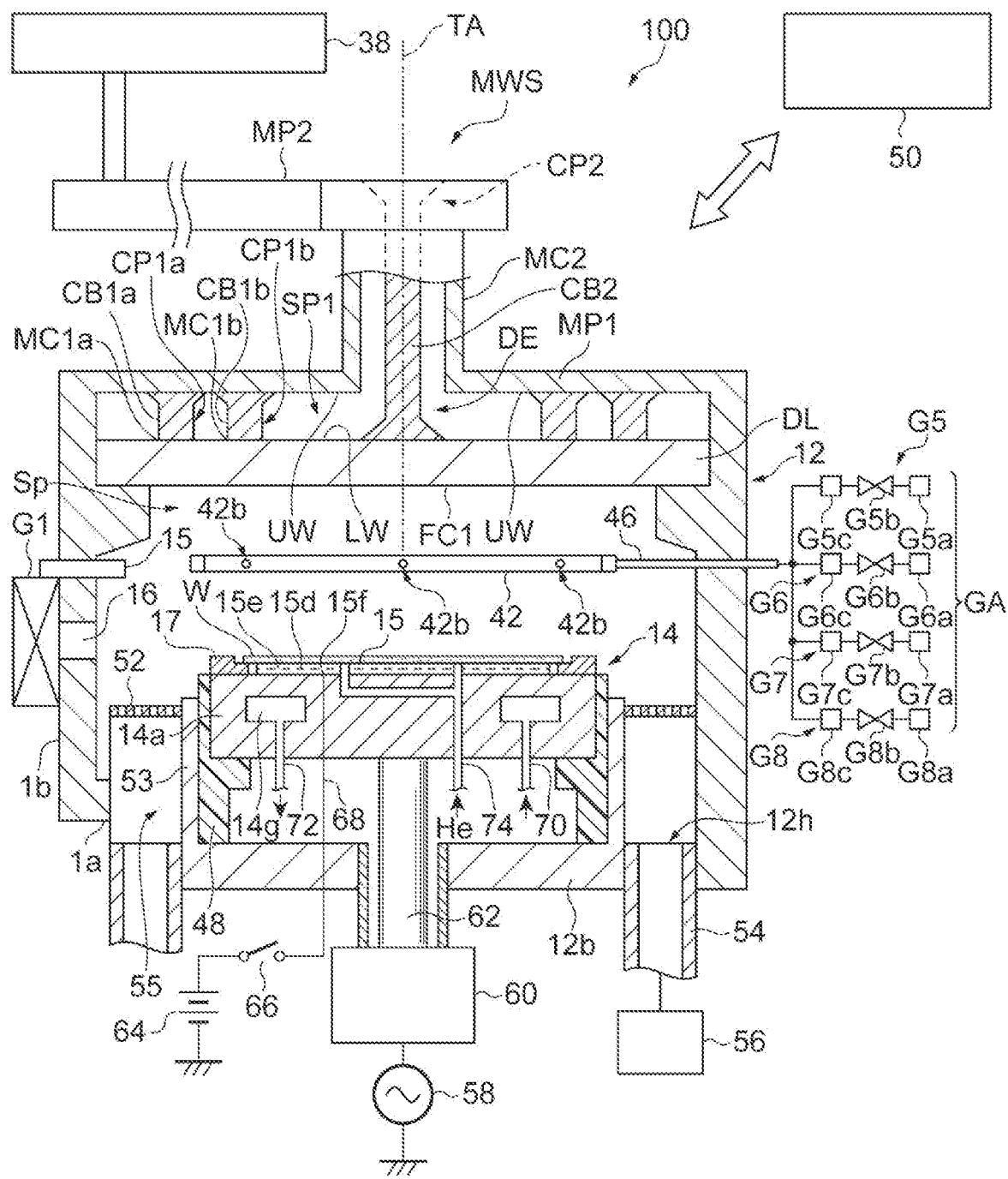
FIG. 4 is a sectional view schematically illustrating a configuration of a plasma processing apparatus in which the antenna device illustrated in FIG. 1 is used.

Next, a configuration of a plasma processing apparatus 100 provided with the antenna device MWS illustrated in FIG. 1 will be described with reference to FIG. 4.

The plasma processing apparatus 100 includes, as main configurations, a processing container 12, a gas supply system GA, an exhaust device, the electromagnetic wave generation system 38, and the antenna MWS. The processing container 12 is configured in an airtight manner. The gas supply system GA supplies gas into the processing container 12.

The exhaust device includes an exhaust device 56 and evacuates and exhausts the inside of the processing container 12. The electromagnetic wave generation system 38 generates electromagnetic waves (microwaves). The antenna device MWS is provided at an upper portion of the processing container 12 and introduces the electromagnetic waves generated by the electromagnetic wave generation system 38 into the processing container 12.

The plasma processing apparatus 100 is provided with a control unit 50 which controls each configuration part of the plasma processing apparatus 100 including the gas supply system GA, the exhaust device, and the antenna device MWS described above.

The electromagnetic wave generation system 38 generates electromagnetic waves (microwaves) and supplies the electromagnetic waves to the antenna device MWS.

The processing container 12 is a substantially cylindrical container that is grounded. The processing container 12 may be formed by a container having a square tubular shape. The processing container 12 has a bottom wall 1$a$ and a side wall 1$b$ having metal such as aluminum or an alloy of metal such as aluminum.

A loading and unloading port 16 and a gate valve G1 are provided in the side wall 1$b$ of the processing container 12. The loading and unloading port 16 performs loading and unloading of a wafer W between the plasma processing apparatus 100 and a vacuum-side transport chamber (not illustrated) adjacent to the plasma processing apparatus 100. The gate valve G1 opens and closes the loading and unloading port 16.

The microwaves generated in the electromagnetic wave generation system 38 are introduced into the processing container 12 by the antenna device MWS having the configuration as described above.

The processing container 12 defines a space Sp for performing plasma processing on the wafer W. The processing container 12 can include the side wall 1$b$ and the bottom wall 1$a$. The side wall 1$b$ has a substantially tubular shape extending in the direction of the tube axis TA (that is, the extending direction of the tube axis TA).

The bottom wall 1$a$ is provided on the lower end side of the side wall 1$b$. An exhaust hole 12$h$ for exhaust is provided in the bottom wall 1$a$. An upper end portion of the side wall 1$b$ is open. The upper end portion opening of the side wall 1$b$ is closed by the dielectric window DL.

The plasma processing apparatus 100 is further provided with a conduit 42. The conduit 42 supplies gas from the surroundings of the tube axis TA to the space Sp between a stage 14 and the dielectric window DL. The conduit 42 annularly extends around the tube axis TA between the dielectric window DL and the stage 14.

A plurality of gas supply holes 42$b$ are formed in the conduit 42. The plurality of gas supply holes 42$b$ are annularly arranged, are open toward the tube axis TA, and supply the gas supplied to the conduit 42 toward the tube axis TA. The conduit 42 is connected to a gas supply unit G5, a gas supply unit G6, a gas supply unit G7, and a gas supply unit G8 through a conduit 46.

The gas supply system GA includes the gas supply unit G5, the gas supply unit G6, the gas supply unit G7, and the gas supply unit G8. The gas supply unit G5 supplies a processing gas set in advance to the conduit 42. The gas supply unit G5 can include a gas source G5$a$, a valve G5$b$, and a flow rate controller G5$c$. The gas supply unit G6 supplies a processing gas set in advance to the conduit 42. The gas supply unit G6 can include a gas source G6a, a valve G6b, and a flow rate controller G6c.

The gas supply unit G7 supplies a processing gas set in advance to the conduit 42. The gas supply unit G7 can include a gas source G7a, a valve G7b, and a flow rate controller G7c. The gas supply unit G8 supplies a processing gas set in advance to the conduit 42. The gas supply unit G8 can include a gas source G8a, a valve G8b, and a flow rate controller G8c.

The stage 14 is provided so as to face the dielectric window DL in the direction of the tube axis TA. The stage 14 is provided such that the space Sp is interposed between the dielectric window DL and the stage 14. The wafer W is placed on the stage 14. The stage 14 can include a base 14a, an electrostatic chuck 15, and a focus ring 17.

The base 14a is supported by a tubular support part 48. The tubular support part 48 has an insulating material and extends vertically upward from the bottom wall 1a. An electrically conductive tubular support part 53 is provided on the outer periphery of the tubular support part 48. The tubular support part 53 extends vertically upward from the bottom wall 1a of the processing container 12 along the outer periphery of the tubular support part 48. An annular exhaust path 55 is formed between the tubular support part 53 and the side wall 1b.

An annular baffle plate 52 provided with a plurality of through-holes is mounted at an upper portion of the exhaust path 55. The exhaust device 56 is connected to a lower portion of the exhaust hole 12h through an exhaust pipe 54. The exhaust device 56 has a vacuum pump such as a turbo-molecular pump. The pressure in the space Sp inside the processing container 12 can be reduced to a desired degree of vacuum by the exhaust device 56.

The base 14a also serves as a high-frequency electrode. A high-frequency power source 58 for RF bias is electrically connected to the base 14a through a matching unit 60 and a power supply rod 62. The high-frequency power source 58 outputs high-frequency power having a certain frequency, for example, 13.65 [MHz], suitable for controlling the energy of ions to be drawn into the wafer W with predetermined power. The matching unit 60 accommodates a matching device for performing matching between impedance on the high-frequency power source 58 side and impedance on the load side such as mainly an electrode, plasma, and the processing container 12. A blocking capacitor for self-bias generation is included in the matching device.

The electrostatic chuck 15 that is a holding member for holding the wafer W is provided on the upper surface of the base 14a. The electrostatic chuck 15 holds the wafer W with an electrostatic attraction force. The focus ring 17 annularly surrounding the periphery of the wafer W and the periphery of the electrostatic chuck 15 is provided on the outer side in a radial direction of the electrostatic chuck 15.

The electrostatic chuck 15 includes an electrode 15d, an insulating film 15e, and an insulating film 15f. The electrode 15d is formed of a conductive film and is provided between the insulating film 15e and the insulating film 15f. A high-voltage direct-current power supply 64 is electrically connected to the electrode 15d through a switch 66 and a covered wire 68. The electrostatic chuck 15 can hold the wafer W with a Coulomb force which is generated by a direct-current voltage which is applied from the direct-current power supply 64.

An annular refrigerant chamber 14g extending in a circumferential direction is provided in the interior of the base 14a. A refrigerant having a predetermined temperature, for example, cooling water is circulated and supplied to the refrigerant chamber 14g from a chiller unit through a pipe 70 and a pipe 72. A processing temperature of the wafer W on the electrostatic chuck 15 can be controlled by the temperature of the refrigerant. In the plasma processing apparatus 100, a heat transfer gas, for example, He gas is supplied between the upper surface of the electrostatic chuck 15 and the back surface of the wafer W through a gas supply pipe 74.

As described above, in the first exemplary embodiment, the electromagnetic waves can be locally radiated from the flat front surface FC1 of the dielectric window DL to the electric discharge area DCEa, the electric discharge area DCEb, or the like illustrated in FIG. 1. The electromagnetic waves can be radiated from the flat front surface FC through the dispersion part DE, the coaxial conversion part CP1a, the coaxial conversion part CP1b, the inner conductor CB1a, and the inner conductor CB1b.

Further, the first inner conductor and the second inner conductor are disposed such that the distances thereof from the tube axis are different from each other. Therefore, even in a case where a sudden transition occurs in the impedance of either the first inner conductor or the second inner conductor, the radiation of the electromagnetic waves from the tube axis side becomes possible.

The body length LKa of the inner conductor CB1a from the opening end EDa to the upper wall UW is a value of an odd multiple of the reference length. Therefore, electromagnetic waves having relatively high intensity can be radiated from the opening end EDa.

The body length LKb of the inner conductor CB1b from the opening end EDb to the upper wall UW is a value of an odd multiple of the reference length. Therefore, electromagnetic waves having relatively high intensity can be radiated from the opening end EDb.

The body length LKa of the inner conductor CB1a is not shorter than the body length LKb of the inner conductor CB1b (is equal to or larger than the body length LKb). In particular, in the case of LKa>LKb, the opening end EDa is closer to the front surface FC of the dielectric window DL than the opening end EDb. Therefore, the electromagnetic wave which is radiated from the opening end EDa has higher intensity than the electromagnetic wave which is radiated from the opening end EDb. In this case, the plasma which is generated in the electric discharge area DCEa of the electromagnetic wave which is radiated from the opening end EDa is higher in density than the plasma which is generated in the electric discharge area DCEb of the electromagnetic wave which is radiated from the opening end EDb.

Further, since the inner conductor CB2 is disposed on the tube axis TA in the coaxial waveguide MC2, the electromagnetic waves can be favorably guided in the coaxial waveguide MC2.

Second Exemplary Embodiment

Figure 5:
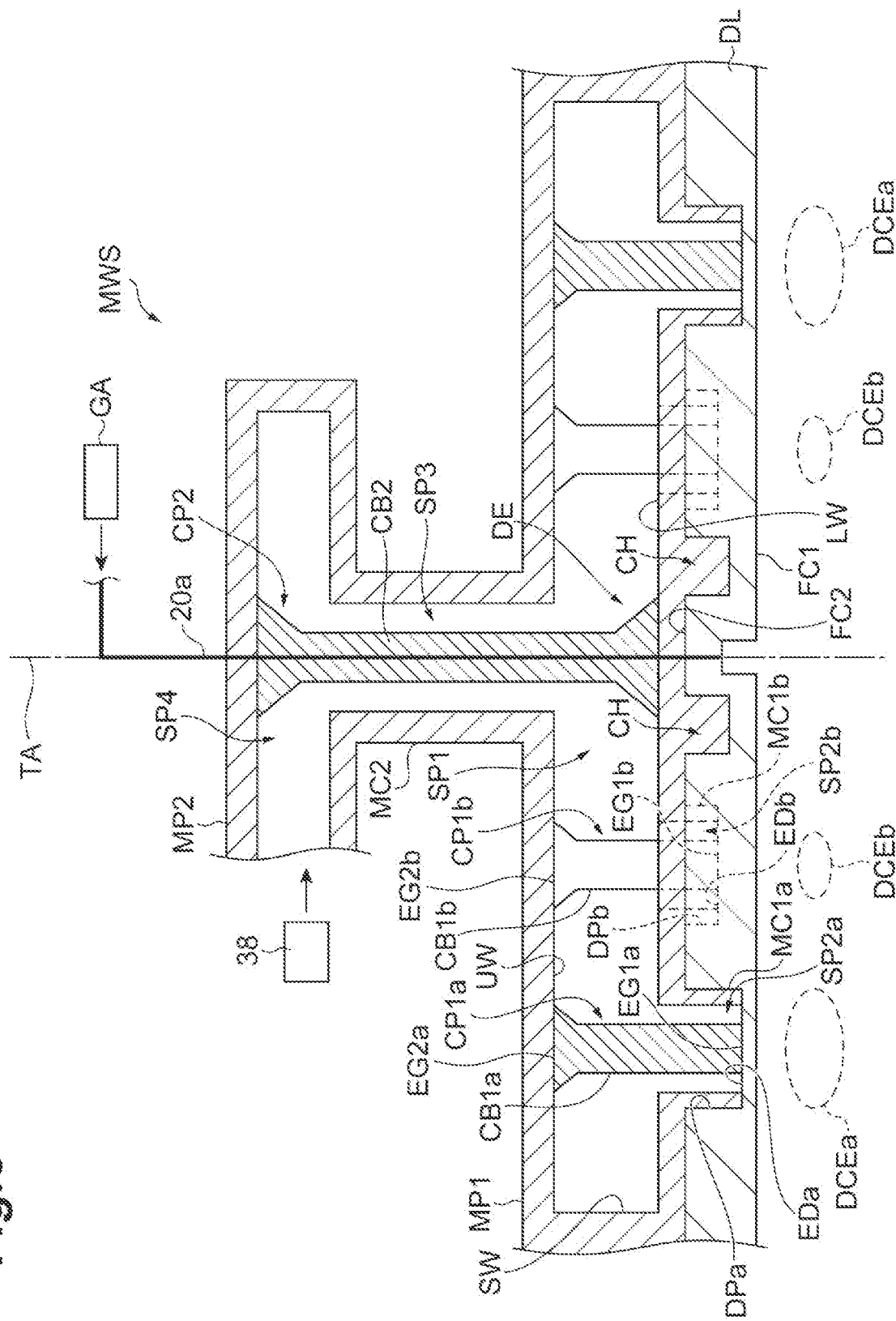
FIG. 5 is a sectional view schematically illustrating another configuration of the antenna device according to one exemplary embodiment.

Another configuration of the antenna device MWS according to one exemplary embodiment will be described with reference to FIG. 5. FIG. 5 is a sectional view schematically illustrating another configuration of the antenna device MWS according to one exemplary embodiment.

The antenna device MWS illustrated in FIG. 5 has a configuration in which a gas line 20a and a choke structure CH are added to the antenna device MWS illustrated in FIG. 1. The gas line 20a which is connected to the external gas supply system GA is provided in the interior of the inner conductor CB2. The gas line 20a penetrates the inner conductor CB2 and the dielectric window DL and communicates with the space Sp on the front surface FC1.

The gas line 20a penetrates the inner conductor CB2 from the coaxial conversion portion CP2 to reach the dielectric window DL and further passes through the dielectric window DL to reach the front surface FC1 of the dielectric window DL. The gas which is supplied from the gas supply system GA can be supplied from the front surface FC1 of the dielectric window DL to the space Sp through the gas line 20a. Further, the choke structure CH is provided in the dielectric window DL.

The choke structure CH is disposed so as to surround the dispersion part DE when viewed from the front surface FC1 of the dielectric window DL. The choke structure CH is provided on the back surface FC2 of the dielectric window DL, is a portion recessed in the back surface FC2 when viewed from above the back surface FC2, and is fitted to the lower wall LW.

In this manner, in the second exemplary embodiment, due to the gas line 20a, it becomes possible to supply preferably a gas from the front surface FC1 of the dielectric window DL into the space Sp on the front surface FC1.

Third Exemplary Embodiment

Figure 6:
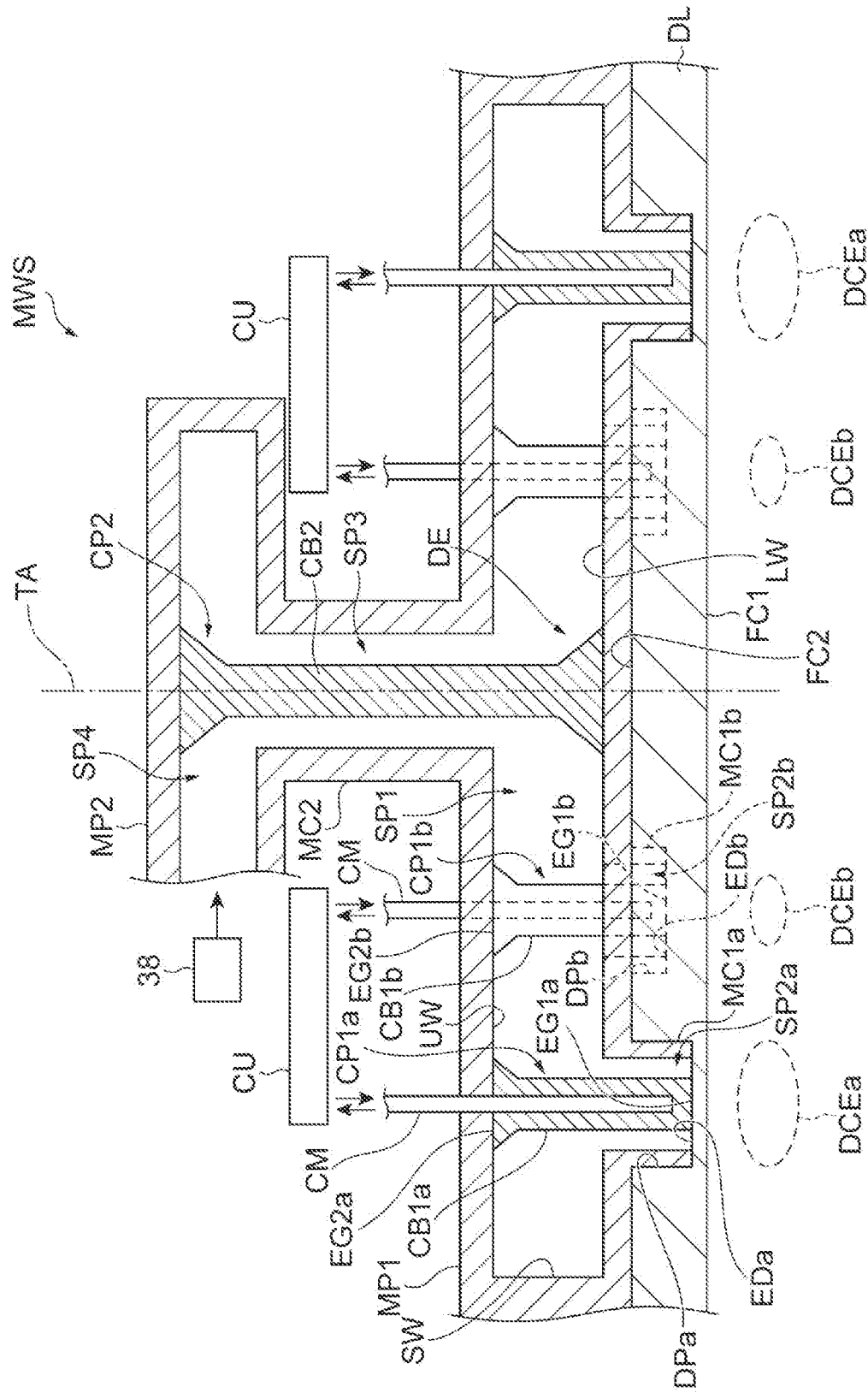
FIG. 6 is a sectional view schematically illustrating another configuration of the antenna device according to one exemplary embodiment.

Another configuration of the antenna device MWS according to one exemplary embodiment will be described with reference to FIG. 6. FIG. 6 is a sectional view schematically illustrating another configuration of the antenna device MWS according to one exemplary embodiment.

The antenna device MWS illustrated in FIG. 6 has a configuration in which a refrigerant tube CM is added to the antenna device MWS illustrated in FIG. 1. The refrigerant tubes CM which are connected to an external chiller unit CU are provided in the interior of the inner conductor CB1a and the interior of the inner conductor CB1b.

In this manner, in the third exemplary embodiment, the inner conductor CB1a which includes the coaxial conversion part CP1a, and the inner conductor CB1b which includes the coaxial conversion part CP1b can be cooled to a suitable temperature by a refrigerant. This refrigerant is supplied (circulated) from the chiller unit CU to the inner conductor CB a and the inner conductor CB1b through the refrigerant tube CM.

When the electromagnetic waves are propagated to the inner conductor CB1a and the coaxial conversion part CP1a and when the electromagnetic waves are propagated to the inner conductor CB1b and the coaxial conversion part CP1b, there may be a case where the inner conductor CB1a, the coaxial conversion part CP1a, the inner conductor CB1b, and the coaxial conversion part CP1b are heated.

Even in such a case, it becomes possible to keep the temperatures of the inner conductor CB1a, the coaxial conversion part CP1a, the inner conductor CB1b, and the coaxial conversion part CP1b constant. For this reason, the conversion of the traveling direction of the electromagnetic wave in each of the coaxial conversion part CP1a and the coaxial conversion part CP1b, and the wave guide of the electromagnetic wave along each of the inner conductor CB1a and the inner conductor CB1b can be stably and favorably realized.

Fourth Exemplary Embodiment

Figure 7:
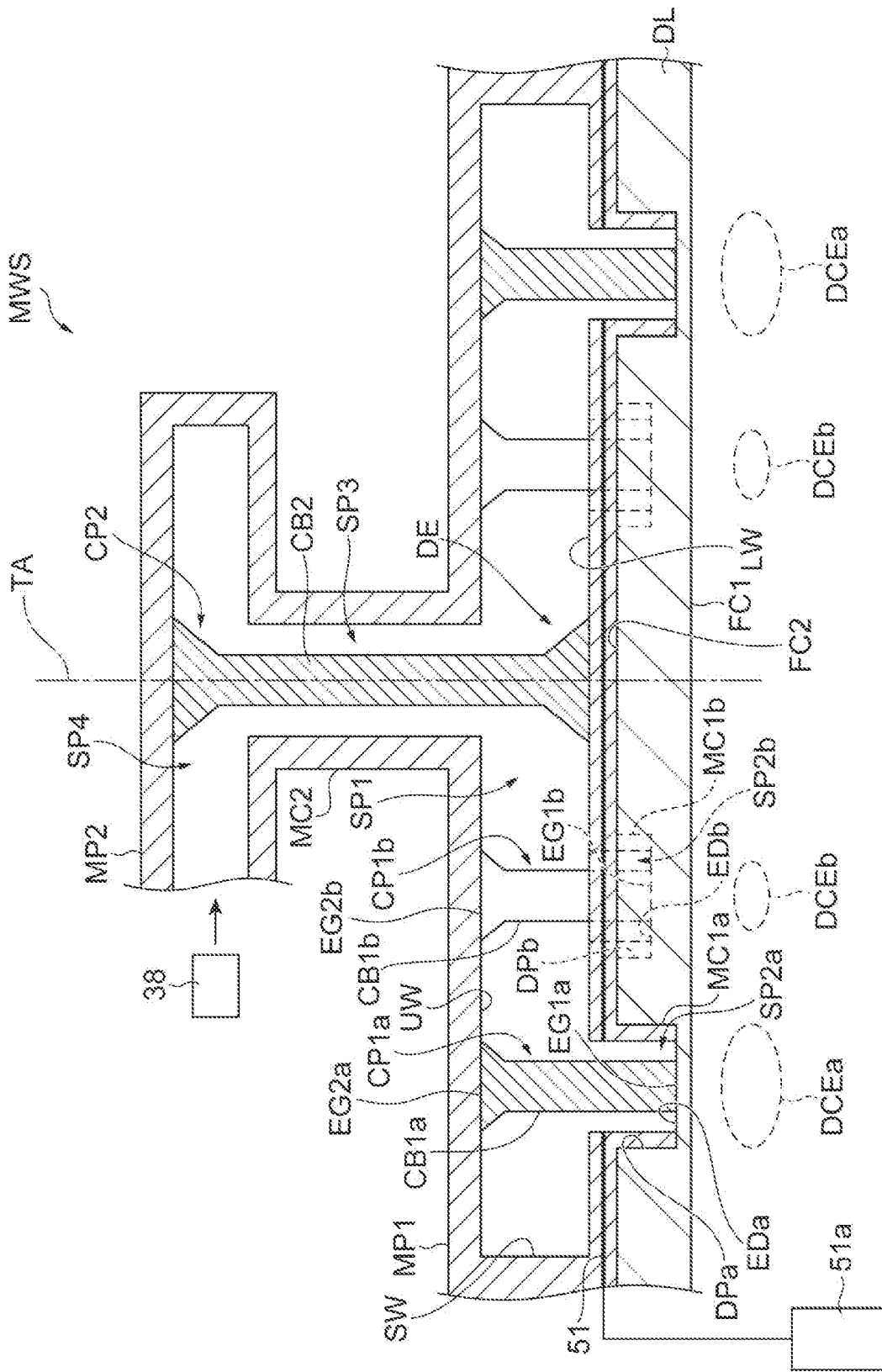
FIG. 7 is a sectional view schematically illustrating another configuration of the antenna device according to one exemplary embodiment.

Another configuration of the antenna device MWS according to one exemplary embodiment will be described with reference to FIG. 7. FIG. 7 is a sectional view schematically illustrating another configuration of the antenna device MWS according to one exemplary embodiment.

The antenna device MWS illustrated in FIG. 7 has a configuration in which a heater 51 is added to the antenna device MWS illustrated in FIG. 1. The heater 51 which is connected to an external heater power supply 51a is provided in the interior of the lower wall LW.

In this manner, in the fourth exemplary embodiment, due to the heater 51, it is possible to raise the temperature of each waveguide such as the distribution waveguide MP1 and the temperature of the dielectric window DL to a suitable temperature. If plasma is generated, the temperature of the dielectric window DL and the temperature of each waveguide such as the distribution waveguide MP1 rise due to heat input from the plasma. However, it is possible to perform heating in advance by the heater 51. For this reason, since a temperature change of each waveguide before the plasma generation and during the plasma generation can be reduced, the wave guide of the electromagnetic waves in each waveguide such as the distribution waveguide MP is favorably performed, and thus stable plasma can be generated.

The heater 51 may be provided in the interior of the lower wall LW, as illustrated in FIG. 7. However, there is no limitation thereto, and it may be provided between the lower wall LW and the dielectric window DL.

Fifth Exemplary Embodiment

Figure 8:
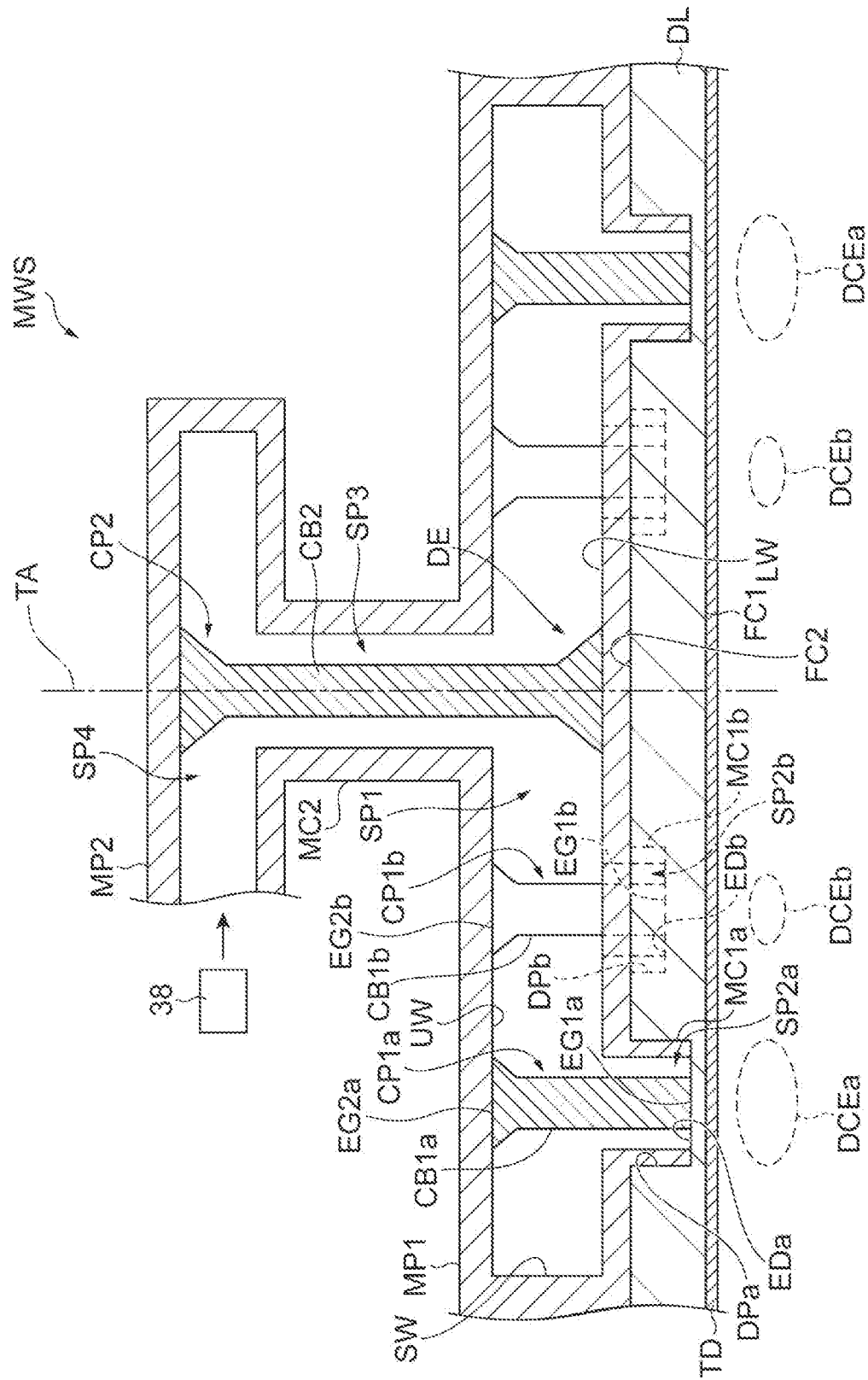
FIG. 8 is a sectional view schematically illustrating another configuration of the antenna device according to one exemplary embodiment.

Another configuration of the antenna device MWS according to one exemplary embodiment will be described with reference to FIG. 8. FIG. 8 is a sectional view schematically illustrating another configuration of the antenna device MWS according to one exemplary embodiment.

The antenna device MWS illustrated in FIG. 8 has a configuration in which a protective film TD is added to the antenna device MWS illustrated in FIG. 1. The protective film TD is provided on the flat front surface FC1 of the dielectric window DL. A material of the protective film TD is a material having plasma resistance and can be, for example, $Y_2O_3$, $YF_3$, Si, $SiO_2$, or SIC.

In this manner, in the fifth exemplary embodiment, since the protective film TD is provided on the flat front surface FC1, the protective film TD can be conformally and easily formed with a uniform film thickness over the front surface FC1.

Sixth Exemplary Embodiment

Figure 9:
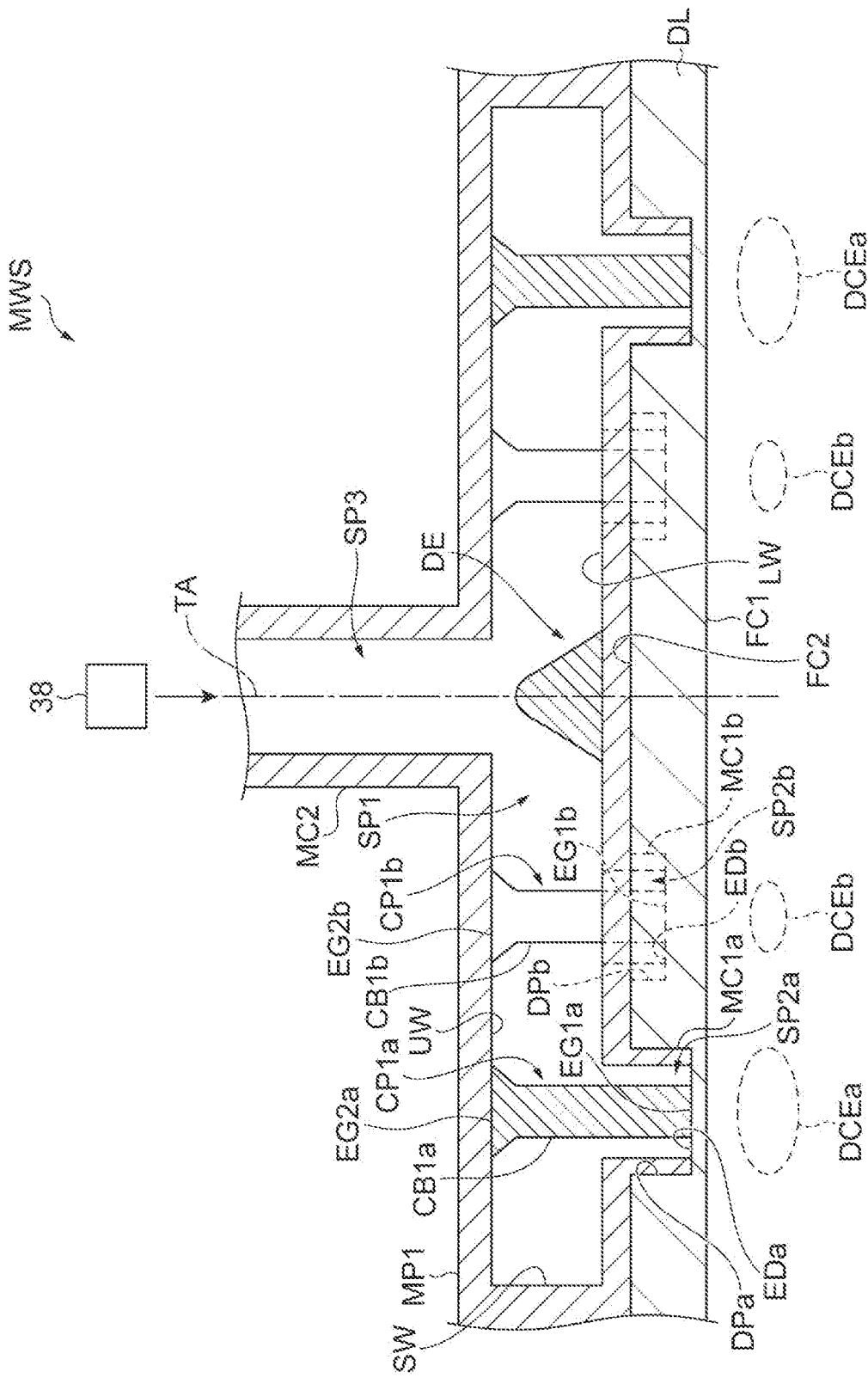
FIG. 9 is a sectional view schematically illustrating another configuration of the antenna device according to one exemplary embodiment.

Another configuration of the antenna device MWS according to one exemplary embodiment will be described with reference to FIG. 9. FIG. 9 is a sectional view schematically illustrating another configuration of the antenna device MWS according to one exemplary embodiment.

The antenna device MWS illustrated in FIG. 9 has a configuration in which the inner conductor CB2 (including the coaxial conversion part CP2) and the introduction waveguide MP2 are not provided in the antenna device MWS illustrated in FIG. 1. The inner conductor CB2 is not disposed in the intra-tube space SP3 of the coaxial waveguide MC2. A dispersion part DE having a conical (or truncated conical) shape or the like is disposed on the lower wall LW and on the tube axis TA of the coaxial waveguide MC2 in the intra-tube space SP of the distribution waveguide MP1.

In this manner, in the sixth exemplary embodiment, the inner conductor CB2 and the introduction waveguide MP2 are not used. Therefore, the shape and structure of the antenna device MWS can be further simplified, so that the antenna device MWS can be easily manufactured and easily mounted to the plasma processing apparatus 100.

The respective configurations of the first to sixth exemplary embodiments described above can be variously combined with each other as much as possible. For example, it is possible to add any one or all of the configurations of the second to fifth exemplary embodiments to the configuration of the first exemplary embodiment. Further, in a case where the configuration of the sixth exemplary embodiment is used in place of the configuration of the first exemplary embodiment, it is possible to further add any one or all of the configurations of the second to fifth exemplary embodiments thereto.

Figure 10A:
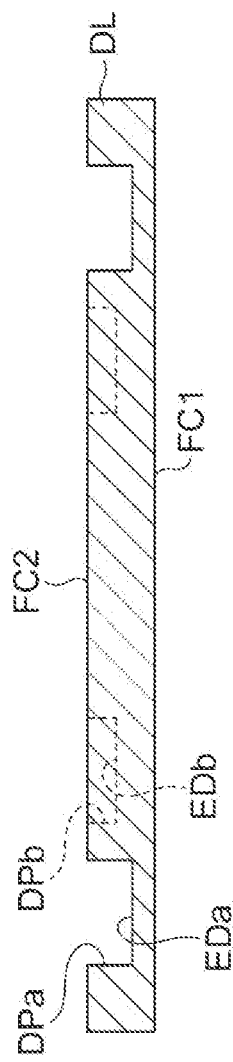
Figure 10B:
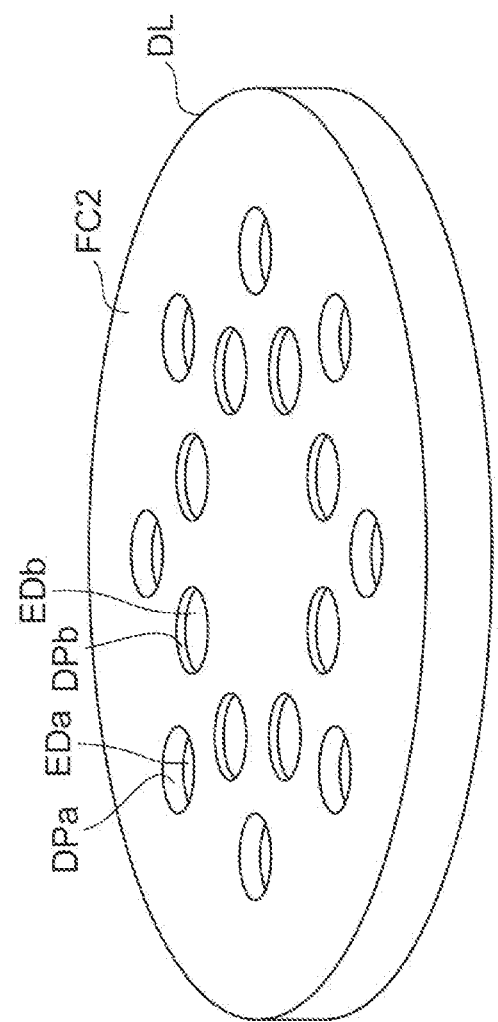
Figure 10C:
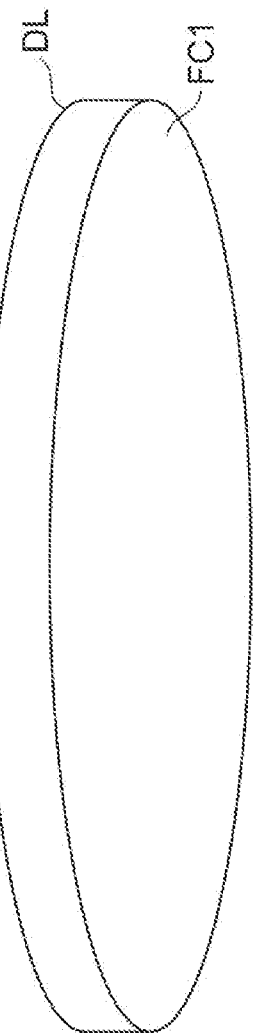

In the first to sixth exemplary embodiments, the dielectric window DL having the flat front surface FC1 is used. Accordingly, it becomes easy to perform coating on the front surface FC1 of the dielectric window DL, such as forming a coating film such as the protective film TD on the front surface FC1 of the dielectric window DL. However, as long as it is a shape in which coating becomes easy, there is no limitation to the above-described shape in which the front surface FC1 of the dielectric window DL is flat. Further, the front surface FC1 having such a flat shape is illustrated in FIGS. 10A to 10C. However, any shape may be used as long as it is a shape having no irregularities, and for example, the front surface FC1 having the shape illustrated in each of FIGS. 11A to 11C, 12A to 12C, 13A to 13C, and 14A to 14C can be used.

Figure 11A:
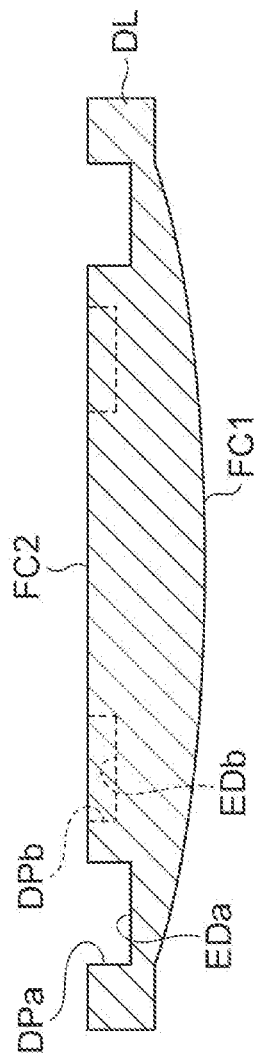
Figure 11B:
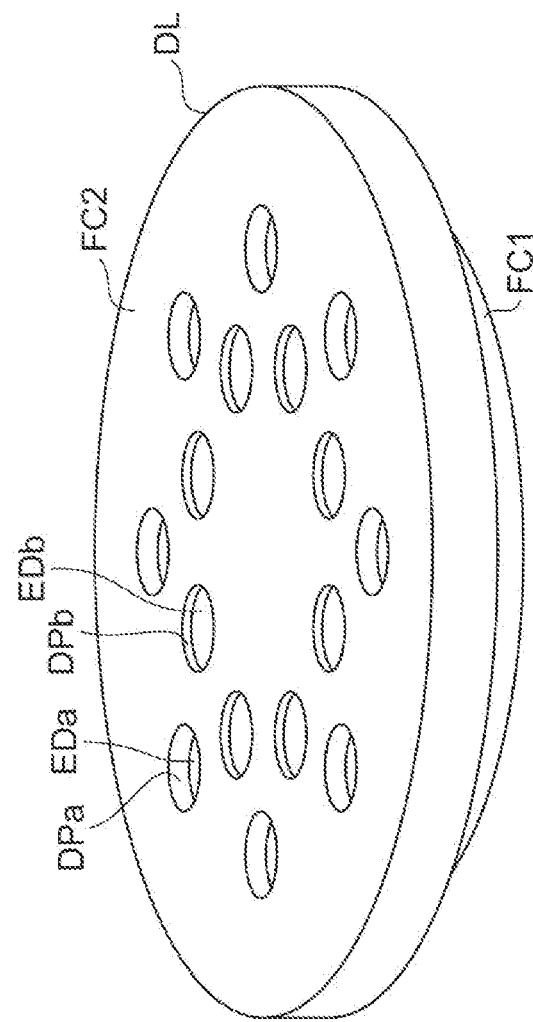
Figure 11C:
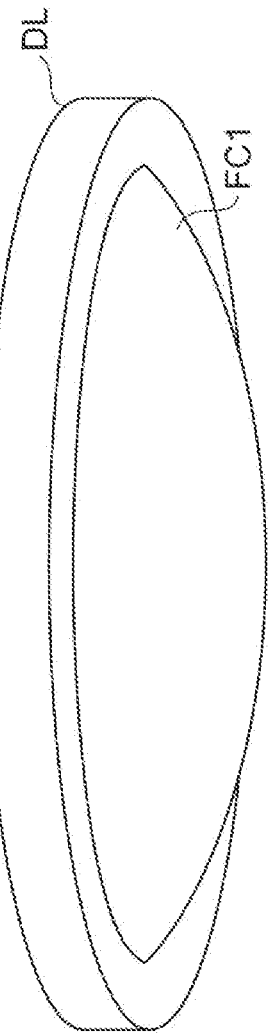

The shape of the front surface FC1 illustrated in FIGS. 11A to 11C is an example of the shape having no irregularities and is a curved surface shape protruding in a direction away from the back surface FC2 of the dielectric window DL.

Figure 12A:
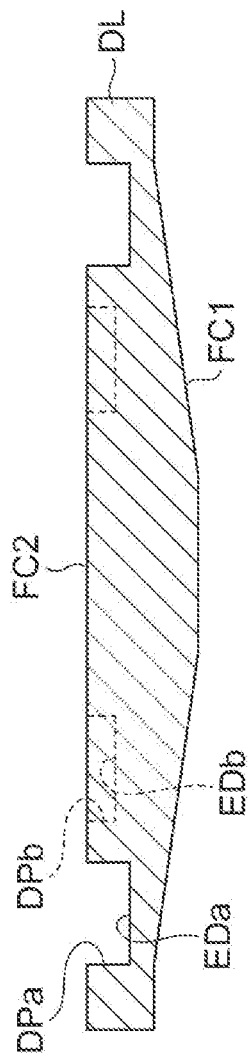
Figure 12B:
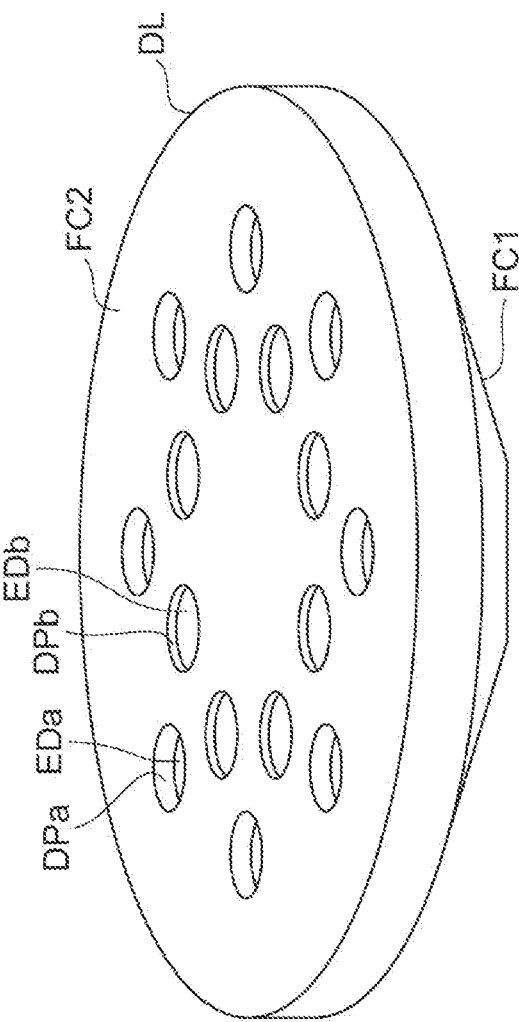
Figure 12C:
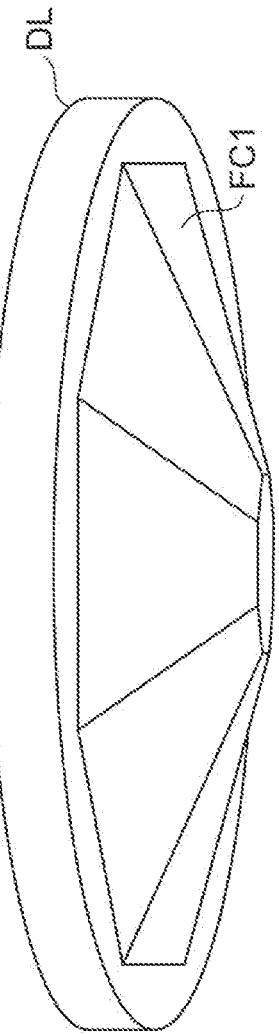

The shape of the front surface FC1 illustrated in FIGS. 12A to 12C is an example of the shape having no irregularities, and it can be said that it is a tapered shape protruding in the direction away from the back surface FC2 of the dielectric window DL. The protruding portion of the front surface FC1 is configured by joining a plurality of quadrangles extending from a base end of the protruding portion toward the apex.

Figure 13A:
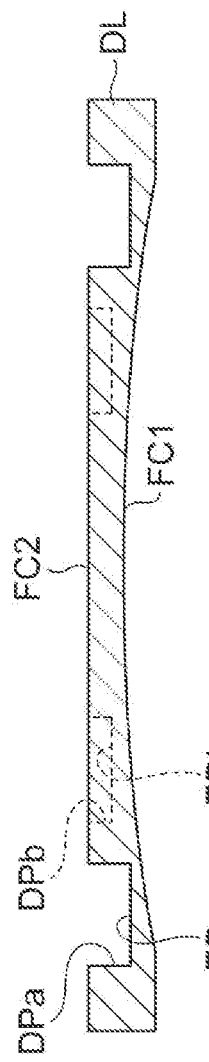
Figure 13B:
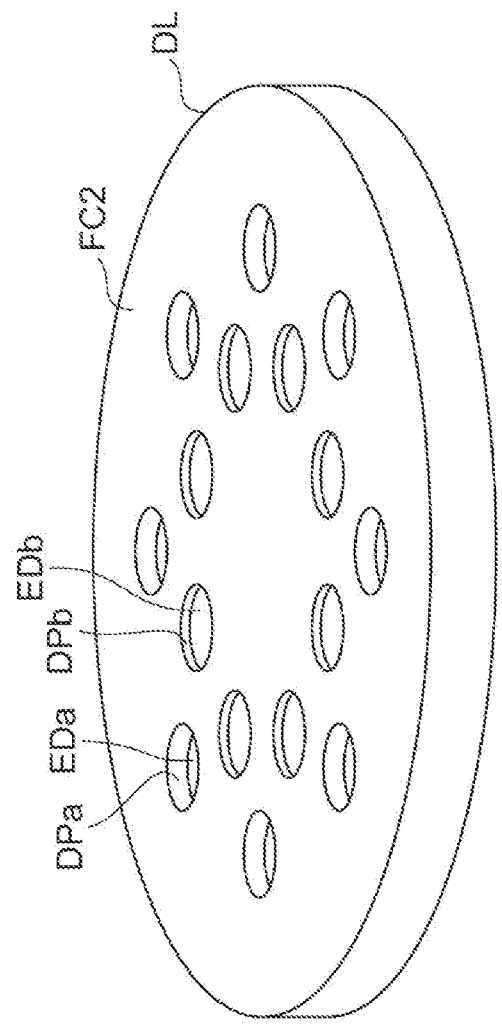
Figure 13C:
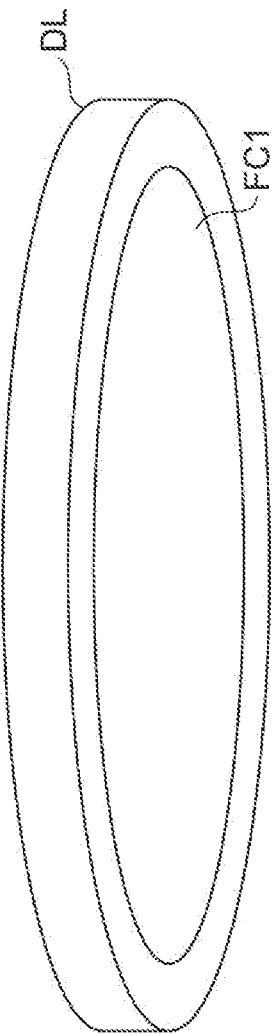

The shape of the front surface FC illustrated in FIGS. 13A to 13C is an example of the shape having no irregularities and is a curved surface shape recessed in a direction toward the back surface FC2 of the dielectric window DL.

Figure 14A:
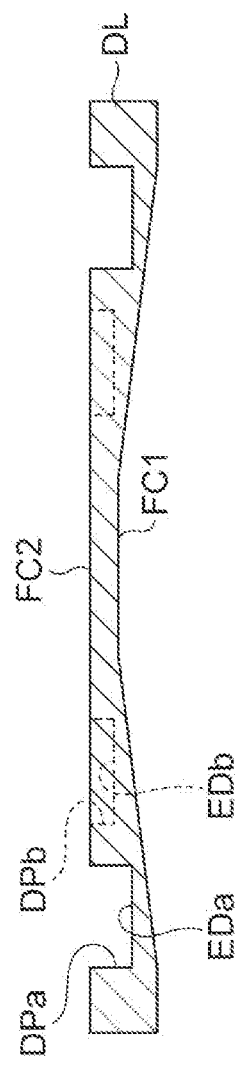
Figure 14B:
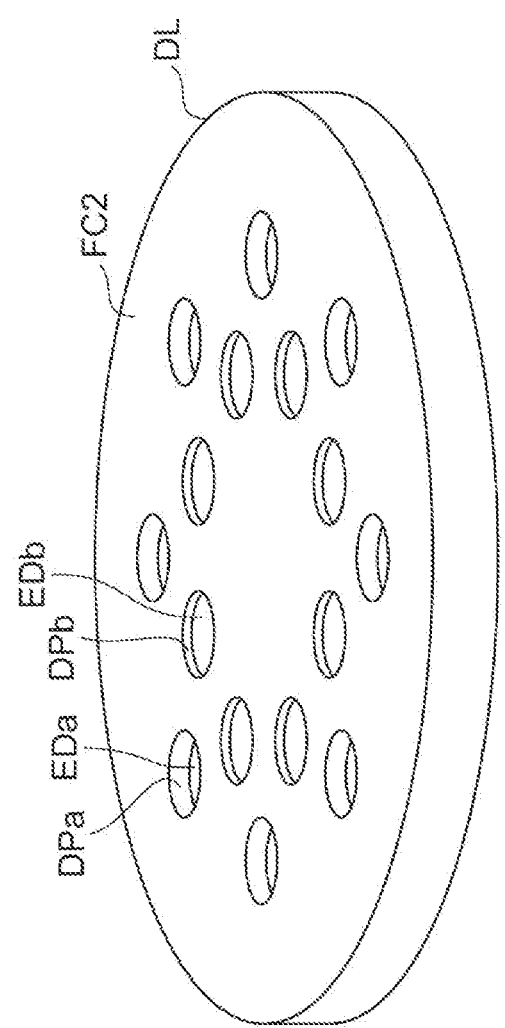
Figure 14C:
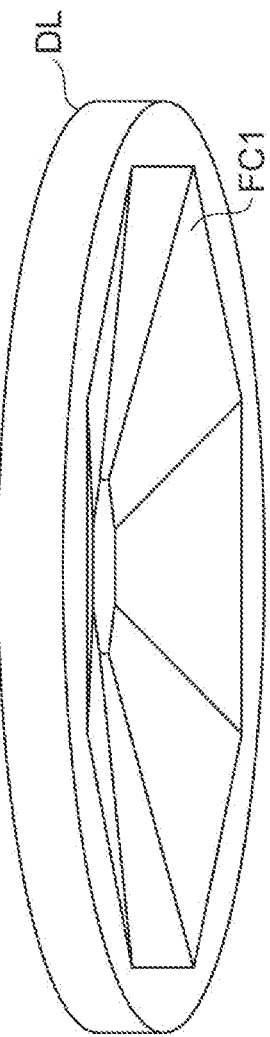

The shape of the front surface FC1 illustrated in FIGS. 14A to 14C is an example of the shape having no irregularities and is a shape recessed in the direction toward the back surface FC2 of the dielectric window DL. The recessed portion of the front surface FC1 is configured by joining a plurality of quadrangles extending toward the deepest bottom portion of the recessed portion.

In any of the above-described various variations of the shape of the front surface FC1, irregularities are not provided in the portion facing the opening end EDa of the coaxial waveguide MC1a, of the front surface FC1, and the portion facing the opening end EDb of the coaxial waveguide MC1b, of the front surface FC1. The shape of the front surface FC1 can be various shapes in which irregularities are not provided.

Various exemplary embodiments have been described above. However, there is no limitation to the exemplary embodiments described above, and various omissions, substitutions, and changes may be made. Further, it is possible to combine elements in different exemplary embodiments to form other exemplary embodiments.

Although various exemplary embodiments have been described above, various modified aspect may be configured without being limited to the above-described exemplary embodiments.

From the foregoing description, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. An antenna device which radiates electromagnetic waves, the device comprising:
    a first waveguide;
    a second waveguide;
    a third waveguide;
    a fourth waveguide;
    a dielectric window;
    a first inner conductor; and
    a second inner conductor,
    wherein the second waveguide is connected to an upper wall of the first waveguide and communicates with the first waveguide,
    the dielectric window is in contact with a lower wall of the first waveguide,
    the first waveguide is provided between the dielectric window and the second waveguide, extends in a direction crossing a tube axis of the second waveguide, and includes a dispersion part, a first coaxial conversion part, and a second coaxial conversion part,
    the third waveguide is connected to the lower wall on the dielectric window side and communicates with the first waveguide,
    the fourth waveguide is connected to the lower wall on the dielectric window side and communicates with the first waveguide,
    the first inner conductor extends along a direction of the tube axis from an inside of the first waveguide to an inside of the third waveguide,
    a first end of the first inner conductor is in contact with the dielectric window through a first opening end of the third waveguide,
    the first opening end is connected to the dielectric window,
    a second end of the first inner conductor is in contact with the upper wall,
    the second inner conductor extends along the direction of the tube axis from the inside of the first waveguide to an inside of the fourth waveguide,
    a third end of the second inner conductor is in contact with the dielectric window through a second opening end of the fourth waveguide,
    the second opening end is connected to the dielectric window,
    a fourth end of the second inner conductor is in contact with the upper wall,
    a first central axis of the first inner conductor and a second central axis of the second inner conductor extend along the tube axis,
    a distance between the first central axis and the tube axis is longer than a distance between the second central axis and the tube axis, the dispersion part is disposed on the tube axis and on the lower wall in the first waveguide and disperses electromagnetic waves guided along the tube axis by the second waveguide in the direction crossing the tube axis in the first waveguide, the first coaxial conversion part is included in the first inner conductor in the first waveguide and causes propagation of the electromagnetic waves which are dispersed by the dispersion part and reach the first inner conductor to direct to the dielectric window side, the second coaxial conversion part is included in the second inner conductor in the first waveguide and causes propagation of the electromagnetic waves which are dispersed by the dispersion part and reach the second inner conductor to direct to the dielectric window side, the dielectric window has a back surface which is in contact with the first waveguide and a front surface disposed on a side opposite to the back surface, and the front surface extends in the direction crossing the tube axis and does not have irregularities.

2. The antenna device according to claim 1, wherein a body length of the first inner conductor from the first opening end to the upper wall is a value of an odd multiple of a reference length set in advance, the body length of the first inner conductor is not shorter than a body length of the second inner conductor, and the reference length is a value of a quarter of a wavelength of the electromagnetic wave which is introduced into the second waveguide and propagates through the second waveguide.

3. The antenna device according to claim 1, wherein the front surface has a flat shape.

4. The antenna device according to claim 1, wherein the front surface has any one of a shape protruding in a direction away from the back surface and having no irregularities, and a shape recessed in a direction toward the back surface and having no irregularities.

5. The antenna device according to claim 4, wherein a shape of the front surface is a curved surface shape.

6. The antenna device according to claim 1, wherein irregularities are not provided in a portion facing the first opening end of the third waveguide, of the front surface, and a portion facing the second opening end of the fourth waveguide, of the front surface.

7. The antenna device according to claim 1, further comprising:

a third inner conductor, wherein the third inner conductor is disposed on the tube axis and extends from an inside of the second waveguide to the inside of the first waveguide.

8. The antenna device according to claim 7, wherein a gas line which is connected to an external gas supply system is provided in an interior of the third inner conductor, and the gas line penetrates the third inner conductor and the dielectric window and communicates with a space on the front surface.

9. The antenna device according to claim 1, wherein a refrigerant tube which is connected to an external chiller unit is provided in an interior of the first inner conductor and an interior of the second inner conductor.

10. The antenna device according to claim 1, wherein a heater which is connected to an external heater power supply is provided in an interior of the lower wall or between the lower wall and the dielectric window.

11. The antenna device according to claim 1, wherein a protective film is provided on the flat front surface of the dielectric window.

12. The antenna device according to claim 1, wherein the first opening end and the second opening end are located between the front surface and the back surface, and a distance between the back surface and the first opening end is not shorter than a distance between the back surface and the second opening end.

13. The antenna device according to claim 12, wherein the dielectric window includes, on the back surface, a first recessed portion which accommodates the third waveguide and a second recessed portion which accommodates the fourth waveguide.

14. The antenna device according to claim 1, wherein in the dielectric window, a distance between the back surface and the front surface is substantially equal to a distance between the first opening end and the front surface.

15. The antenna device according to claim 14, wherein a thickness of the lower wall is substantially equal to a thickness of the upper wall.

16. The antenna device according to claim 14, wherein a thickness of the lower wall is thicker than a thickness of the upper wall.

17. A plasma processing apparatus comprising:
the antenna device according to claim 1.

* * * * *